US010790332B2

(12) United States Patent
Block et al.

(10) Patent No.: US 10,790,332 B2
(45) Date of Patent: Sep. 29, 2020

(54) TECHNIQUES FOR INTEGRATING THREE-DIMENSIONAL ISLANDS FOR RADIO FREQUENCY (RF) CIRCUITS

(71) Applicant: Intel Corporation, Santa Clara, CA (US)

(72) Inventors: Bruce A. Block, Portland, OR (US);
Paul B. Fischer, Portland, OR (US);
Nebil Tanzi, Hoffman Estates, IL (US);
Gregory Chance, Oberhaching (DE);
Han Wui Then, Portland, OR (US);
Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/778,603

(22) PCT Filed: Dec. 24, 2015

(86) PCT No.: PCT/US2015/000347
§ 371 (c)(1),
(2) Date: May 23, 2018

(87) PCT Pub. No.: WO2017/111805
PCT Pub. Date: Jun. 29, 2017

(65) Prior Publication Data
US 2018/0358406 A1 Dec. 13, 2018

(51) Int. Cl.
*H01L 21/50* (2006.01)
*H01L 27/20* (2006.01)
(Continued)

(52) U.S. Cl.
CPC .......... *H01L 27/20* (2013.01); *H01L 23/48* (2013.01); *H01L 23/66* (2013.01); *H01L 24/00* (2013.01);
(Continued)

(58) Field of Classification Search
CPC .............. H01L 27/20; H01L 23/48; H01L 2924/15311; H01L 2924/00014;
(Continued)

(56) References Cited

U.S. PATENT DOCUMENTS 5,231,327 A 7/1993 Ketcham
2006/0108675 A1* 5/2006 Colgan ............... B81C 1/00293
257/684
(Continued)

FOREIGN PATENT DOCUMENTS

WO WO2015-161257 A1 10/2015

OTHER PUBLICATIONS

International Search Report and Written Opinion dated Aug. 24, 2016 for International Application No. PCT/US2015/000347, 12 pages.

*Primary Examiner* — Steven H Loke
*Assistant Examiner* — Samuel Park
(74) *Attorney, Agent, or Firm* — Schwabe, Williamson & Wyatt, P.C.

(57) ABSTRACT

Techniques to fabricate an RF filter using 3 dimensional island integration are described. A donor wafer assembly may have a substrate with a first and second side. A first side of a resonator layer, which may include a plurality of resonator circuits, may be coupled to the first side of the substrate. A weak adhesive layer may be coupled to the second side of the resonator layer, followed by a low-temperature oxide layer and a carrier wafer. A cavity in the first side of the resonator layer may expose an electrode of
(Continued)

the first resonator circuit. An RF assembly may have an RF wafer having a first and a second side, where the first side may have an oxide mesa coupled to an oxide layer. A first resonator circuit may be then coupled to the oxide mesa of the first side of the RF wafer.

5 Claims, 28 Drawing Sheets

(51) Int. Cl.
| | |
|---|---|
| H01L 23/00 | (2006.01) |
| H01L 23/48 | (2006.01) |
| H01L 23/66 | (2006.01) |
| H03H 3/007 | (2006.01) |
| H03H 9/05 | (2006.01) |
| H01L 29/20 | (2006.01) |
| H01L 29/66 | (2006.01) |
| H01L 29/778 | (2006.01) |
| H03H 3/02 | (2006.01) |
| H03H 9/17 | (2006.01) |
| H03H 9/56 | (2006.01) |
| H03H 9/15 | (2006.01) |

(52) U.S. Cl.
CPC .... *H01L 29/2003* (2013.01); *H01L 29/66462* (2013.01); *H01L 29/7787* (2013.01); *H03H 3/0073* (2013.01); *H03H 3/02* (2013.01); *H03H 9/0557* (2013.01); *H03H 9/172* (2013.01); *H03H 9/173* (2013.01); *H03H 9/174* (2013.01); *H03H 9/176* (2013.01); *H03H 9/562* (2013.01); *H03H 9/564* (2013.01); *H03H 9/568* (2013.01); *H01L 2224/16225* (2013.01); *H01L 2224/73204* (2013.01); *H01L 2924/00014* (2013.01); *H01L 2924/10253* (2013.01); *H01L 2924/1421* (2013.01); *H01L 2924/1433* (2013.01); *H01L 2924/1434* (2013.01); *H01L 2924/15311* (2013.01); *H03H 2003/021* (2013.01); *H03H 2003/023* (2013.01); *H03H 2009/155* (2013.01)

(58) Field of Classification Search
CPC . H01L 2224/73204; H01L 2224/16225; H01L 23/66; H01L 29/7787; H01L 29/2003; H01L 29/66462; H01L 23/552; H01L 24/48; H01L 21/76898; H01L 21/8221; H01L 21/84; H03H 9/0557; H03H 9/174; H03H 9/564; H03H 9/562; H03H 2003/021; H03H 2003/023; H03H 2009/155; H03H 3/0073; H03H 9/173; H03H 9/568; H03H 9/172; H03H 3/02; H03H 9/176

See application file for complete search history.

(56) References Cited

U.S. PATENT DOCUMENTS

| | | | |
|---|---|---|---|
| 2006/0125084 A1* | 6/2006 | Fazzio | B81C 1/00238 257/704 |
| 2006/0128058 A1* | 6/2006 | Dungan | B81C 1/0023 438/106 |
| 2007/0267942 A1 | 11/2007 | Matsumoto et al. | |
| 2009/0108381 A1 | 4/2009 | Buchwalter et al. | |
| 2010/0075481 A1* | 3/2010 | Yang | B81C 1/00246 438/458 |
| 2011/0027930 A1* | 2/2011 | El-Gamal | H01L 23/481 438/51 |
| 2013/0154088 A1* | 6/2013 | Cable | H01L 27/1203 257/737 |
| 2014/0264643 A1 | 9/2014 | Baskaran | |
| 2014/0311241 A1* | 10/2014 | Kitano | G01L 9/008 73/384 |
| 2015/0035089 A1 | 2/2015 | Liu et al. | |
| 2015/0102390 A1* | 4/2015 | Liu | H01L 24/05 257/254 |
| 2016/0028367 A1* | 1/2016 | Shealy | H03H 3/02 310/321 |
| 2016/0229685 A1* | 8/2016 | Boysel | B81B 7/007 |
| 2016/0336922 A1* | 11/2016 | Zeng | H03J 3/02 |

* cited by examiner

RF switches, power amplifiers, and passives

TECHNIQUES FOR INTEGRATING THREE-DIMENSIONAL ISLANDS FOR RADIO FREQUENCY (RF) CIRCUITS

CROSS REFERENCE TO RELATED APPLICATIONS

The present application is a national phase entry under 35 U.S.C. § 371 of International Application No. PCT/US2015/000347, filed Dec. 24, 2015, entitled "TECHNIQUES FOR INTEGRATING THREE-DIMENSIONAL ISLANDS FOR RADIO FREQUENCY (RF) CIRCUITS", which designated, among the various States, the United States of America. The PCT/US2015/000347 Application is hereby incorporated by reference in its entirety.

FIELD

Embodiments of the present disclosure generally relate to the field of integrated circuits, and more particularly, to techniques to integrate three-dimensional islands for radio frequency (RF) circuits.

BACKGROUND

Demand is increasing at a very rapid rate for RF circuits, such as filters, switches, and power amplifiers, on a single substrate. As devices become increasingly smaller and more complex, these single substrate form factors that are smaller with improved performance are desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
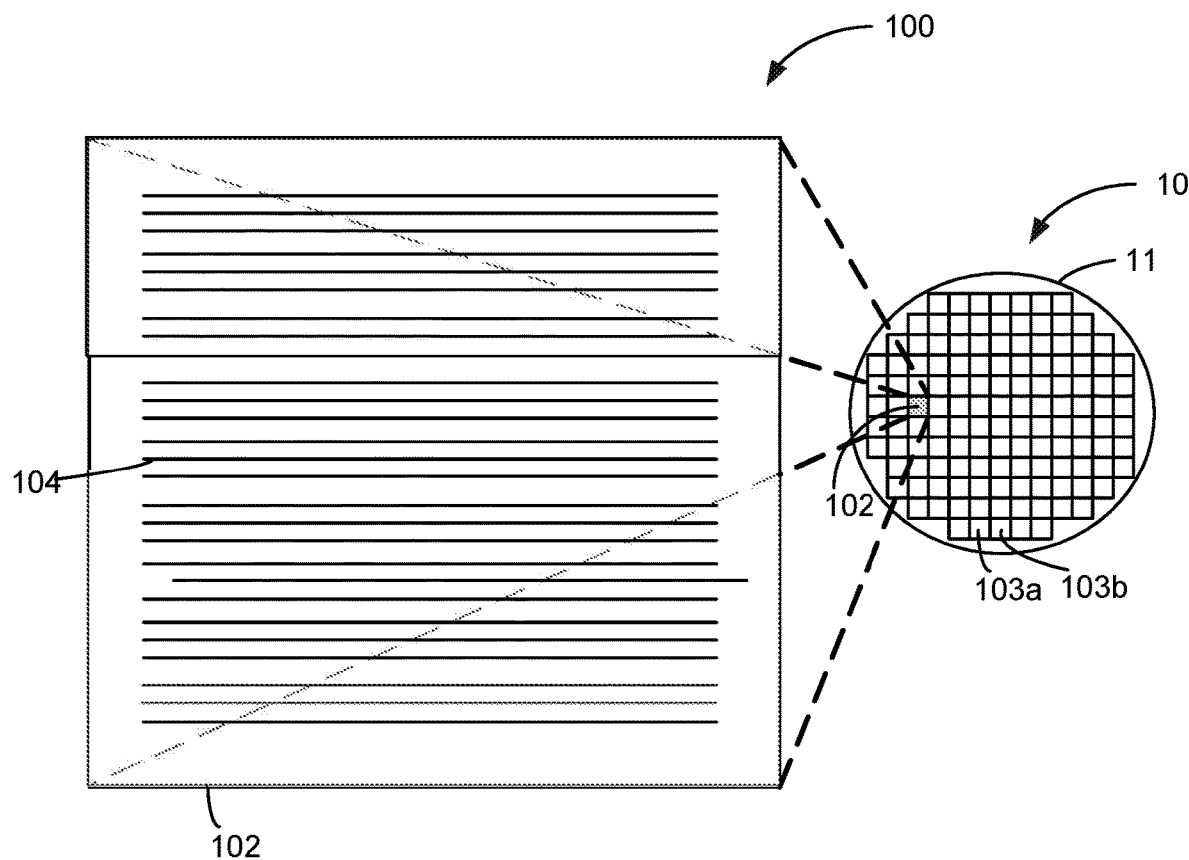
FIG. 1 schematically illustrates a top view of an example die in wafer form and insinuated form, in accordance with some embodiments.

Techniques to fabricate an RF filter using 3-dimensional island integration are described. A donor wafer assembly may have a substrate with a first and second side. A first side of a resonator layer, which may include a plurality of resonator circuits, may be coupled to the first side of the substrate. A weak adhesive layer may be coupled to the second side of the resonator layer, followed by a low-temperature oxide layer and a carrier wafer. A cavity in the first side of the resonator layer may expose an electrode of the first resonator circuit. An RF assembly may have an RF wafer having a first and a second side, where the first side may have an oxide mesa coupled to an oxide layer. A first resonator circuit may be then coupled to the oxide mesa of the first side of the RF wafer.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 111 composed of semiconductor material such as, for example, silicon or other suitable material. The plurality of dies may be formed on a surface of the wafer 111. Each of the dies may be a repeating unit of a semiconductor product that includes one or more integrated circuit (IC) structures (e.g., IC structure 400 of FIG. 13) as described herein. For example, the die 102 may include circuitry having transistor structures 104 such as, for example, one or more channel bodies (e.g., fin structures, nanowires, planar bodies, etc.) that provide a channel pathway for mobile charge carriers of one or more transistor devices or source/drain regions. Electrical interconnect structures such as, for example, transistor electrode assemblies (e.g., terminal contacts) may be formed on and coupled with the one or more transistor structures 104 to route electrical energy to or from the transistor structures 104. For example, terminal contacts may be electrically coupled with a channel body to provide a gate electrode for delivery of a threshold voltage and/or a source/drain current to provide mobile charge carriers for operation of a transistor device. Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the transistor structures 104 may be disposed on a semiconductor substrate in wafer form 10 or singulated form 100. The transistor structures 104 described herein may be incorporated in a die 102 for logic or memory, or combinations thereof. In some embodiments, the transistor structures 104 may be part of a system-on-chip (SoC) assembly.

In various embodiments, the die 102 may include the host RF circuit and/or RF island circuit as described herein. For example, the RF circuit 310 of FIG. 3 and/or an IC structure formed using methods 500, 700, 900, or 1100.

Figure 2:
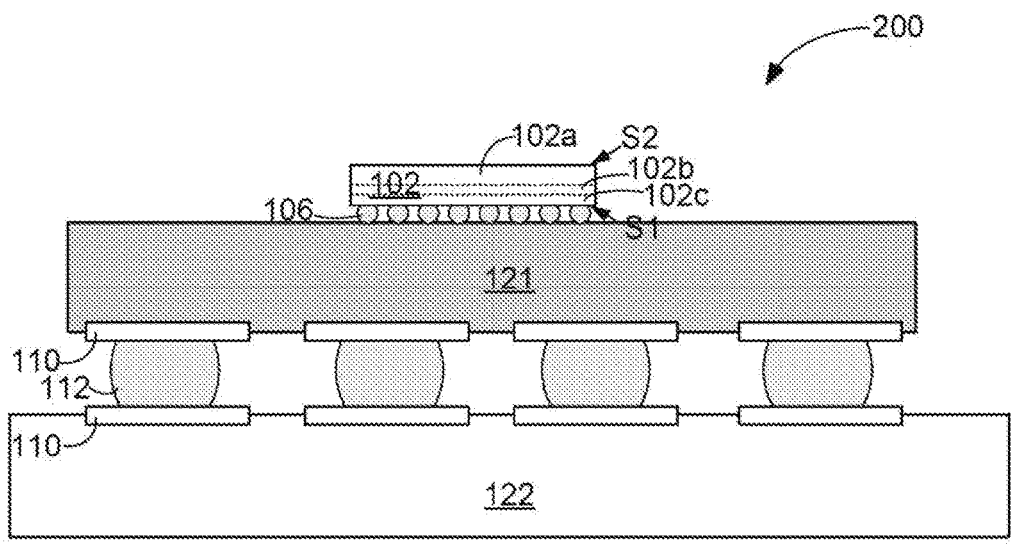
FIG. 2 schematically illustrates a cross-section side view of an integrated circuit (IC) assembly, in accordance with some embodiments.

FIG. 2 schematically illustrates a cross-section side view of an IC assembly 200, in accordance with some embodiments. In some embodiments, the IC assembly 200 may include one or more dies (hereinafter "die 102") electrically and/or physically coupled with a package substrate 121. In some embodiments, the package substrate 121 may be electrically coupled with a circuit board 122, as can be seen. In some embodiments, an IC assembly 200 may include one or more of the die 102, package substrate 121 and/or circuit board 122, according to various embodiments. Embodiments described herein for an IC structure may be implemented in any suitable IC device according to various embodiments.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include active devices such as, for example, transistor devices. An inactive side, S2, may be disposed opposite to the active side S1, as can be seen.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example silicon, in some embodiments. The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures that are configured to route electrical signals to or from the active devices in the device layer 102b. For example, the interconnect layer 102c may include horizontal lines (e.g., trenches) and/or vertical plugs (e.g., vias) or other suitable features to provide electrical routing and/or contacts.

In various embodiments, the die 102 may include an RF island circuit (e.g., including one or more RF resonators, filters, amplifiers, or other RF circuits) coupled to a host circuit, as further described below.

In some embodiments, the die-level interconnect structures 106 may be electrically coupled with the interconnect layer 102c and configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1302 of FIG. 13).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
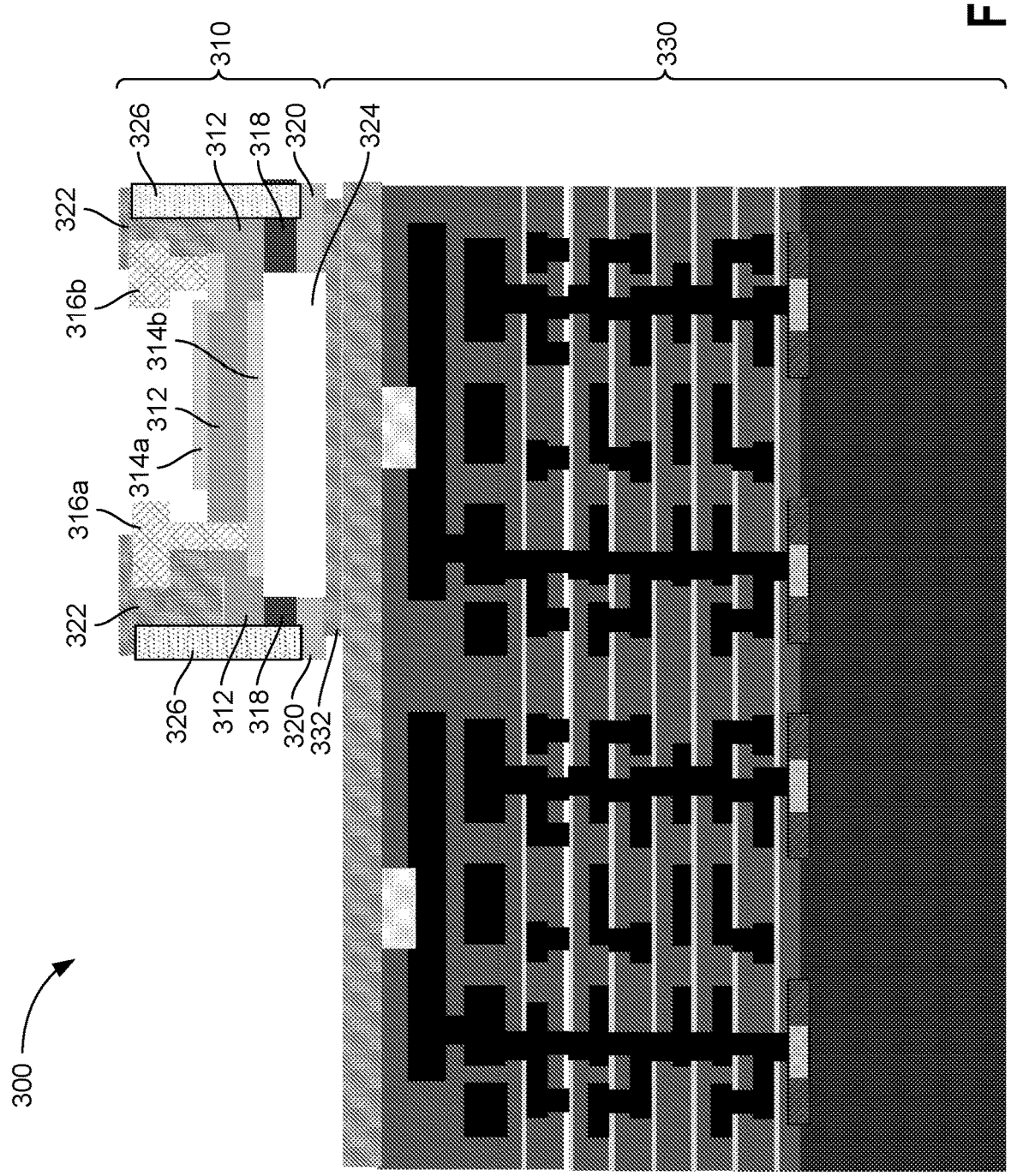
FIG. 3 schematically illustrates a cross-section side view of an integrated circuit (IC) assembly, in accordance with some embodiments.

FIG. 3 schematically illustrates a cross-section side view of an IC assembly 300, in accordance with some embodiments. In some embodiments, the IC assembly 300 may include one or more resonators 310, for example microelectromechanical system (MEMS) resonators electrically and/or physically coupled with an RF host circuit 330. In some embodiments, a raised portion (oxide mesa) 332 on one side of the RF host circuit 330 may be connected to the resonator 310.

In embodiments, a 3D island printing process may be used to place RF MEMS resonators 310 that may be configured in filter arrays (not shown) onto the RF host circuit 330. In some embodiments, the RF MEMS resonators 310 may be coupled to the RF host circuit 330 when the RF host circuit 330 is in wafer form (e.g., on a wafer with a plurality of RF host circuits). In embodiments, the RF host circuit 230 may include other RF devices, including, in non-limiting examples, switches, amplifiers, and/or passive devices. In some embodiments, the die 102 may be, include, or be a part of a processor, memory, SoC or ASIC.

In embodiments, the 3D island printing process may enable the transfer of MEMs resonators 210 that have their active resonator layers released as a freestanding membrane (e.g., exposed to enable electrical coupling to the RF host circuit 330) prior to their transfer such that the undercut etch or backside etch is not needed. Additionally, this 3D island printing process may enable the use of an epitaxially deposited piezoelectric layer 312 in the resonators 310 with improved material properties compared to non-epitaxial textured films in legacy devices. In addition, the 3D island printing process may result in less wasted die area than a wafer to wafer bonding process. Also, trimming of the RF devices may be simplified by having better uniformity with an epitaxial deposition process and also by being able to selectively place devices with the known good frequencies. In embodiments, the frequency of a resonator may be sensitive to process variations such as thickness for bulk acoustic wave (BAW) and film bulk acoustic resonators (FBAR) devices. Process variations may lead to center frequency drift. For example, if the thickness is measured accurately, the frequency may be predicted based off of the thickness. Also the frequency may be measured prior to bonding. If the thickness is outside of a tolerance range, the resonator may not be transferred, and the resulting yield may be improved by only transferring the known good resonators.

In embodiments, a 3D transfer process may be used to transfer RF switches and/or power amplifiers (PAs) to the RF MEMS resonator 310 die or even RF components to a CMOS die. In embodiments, the MEMS resonators 310 may include a metallized structure 312 (e.g., aluminum nitride (AlN) metallized structure) that is sandwiched between a first metal electrode 314a and a second metal electrode 314b. A first contact 316a and a second contact 316b may be coupled to the respective metal electrodes 314a and 314b.

In embodiments, below the metallized structure 312 and/or the second electrode 314b, may be a cavity 324 and/or an oxide layer 318. Below the oxide layer 318 may be a silicon layer 320 that may attach to the oxide mesa 332 of the RF host circuit 330. In embodiments, dielectric material 322 may be above the metallized structure 312 and/or adjacent to the contacts 316a, 316b.

In embodiments, the RF MEMS resonator 310 may be separated from adjacent resonators on the wafer by a gap material 326. In embodiments, the gap material 326 may be made of a material having poor cohesive strength. In one non-limiting example, the gap material 326 may be a porous dielectric. In embodiments, a plurality of MEMS resonators 310 may be fabricated on a wafer, such as described in process 400 of FIG. 4, and may be separated from each other on the wafer by the gap material 326. In embodiments, when one of the plurality of MEMS resonators 310 on a wafer is coupled to the oxide mesa 332, and the wafer is taken away, the MEMS resonator 310 that is coupled with the oxide mesa may break off from the wafer at the region of the gap material 326 that surrounds the MEMS resonator 310.

Figure 4:
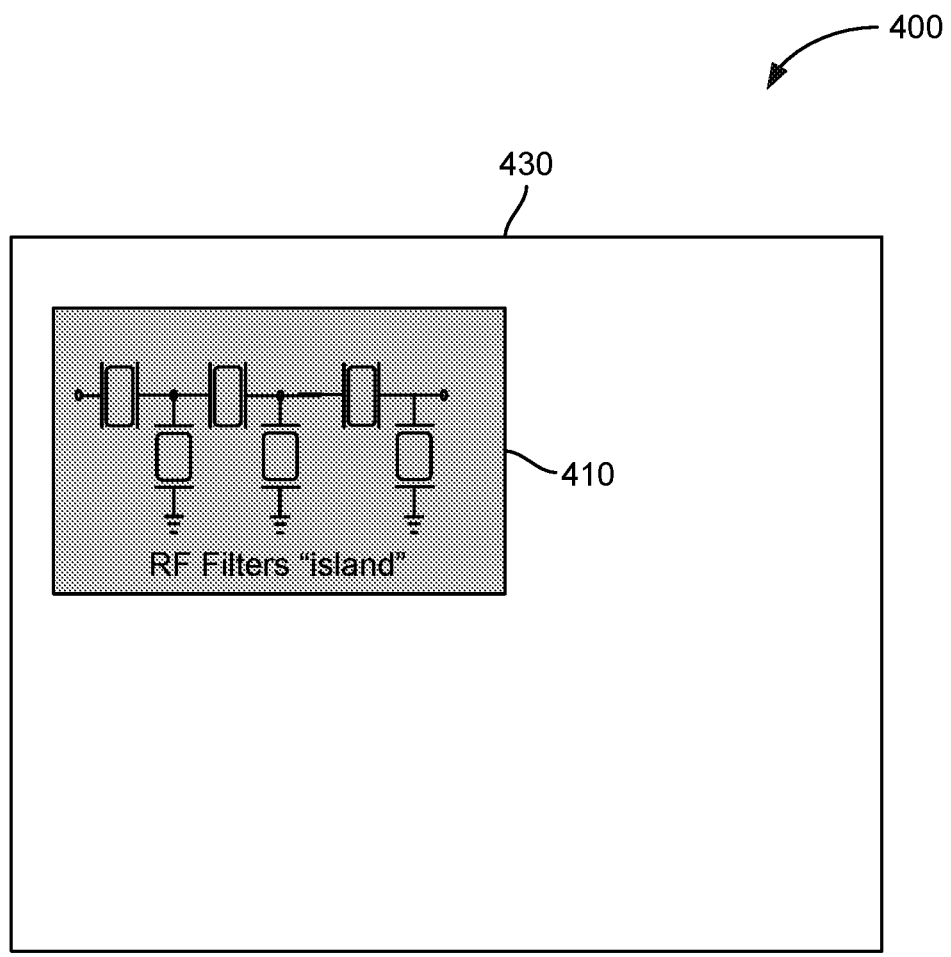
FIG. 4 schematically illustrates a top view of an example die in singulated form, in accordance with some embodiments.

FIG. 4 schematically illustrates a top view of an example die in simulated form, in accordance with some embodiments. Die 400 indicates an example RF die 430, which may contain RF switches, power amplifiers, and/or other passive devices, to which an RF MEMS filter island, 410, is transferred and coupled.

In embodiments MEMS resonators, that may be similar to the MEMS resonators 310 of FIG. 3, may be arranged to form an RF filter of the RF MEMS filter island 410. For example, in one non-limiting example, the RF filter may be a ladder type filter. In embodiments, a donor wafer may include a plurality of islands 410. The donor wafer may be similar to donor wafer 631 in FIG. 6F. An RF MEMS filter island 410 of the donor wafer may be bonded to a receiver (host) circuit, for example a host circuit that may be similar to RF host circuit 330 of FIG. 3. In some embodiments, the RF MEMS filter island 410 of the donor wafer may be bonded to a host circuit of a receiver wafer that includes a plurality of host circuits. In embodiments, the host circuit may include gallium nitride (GaN), gallium arsenic (GaAs), or SOI and/or may contain RF power amplifiers, switches and/or passive elements. In embodiments, the resonators may include AlN FBARs.

Figure 5:
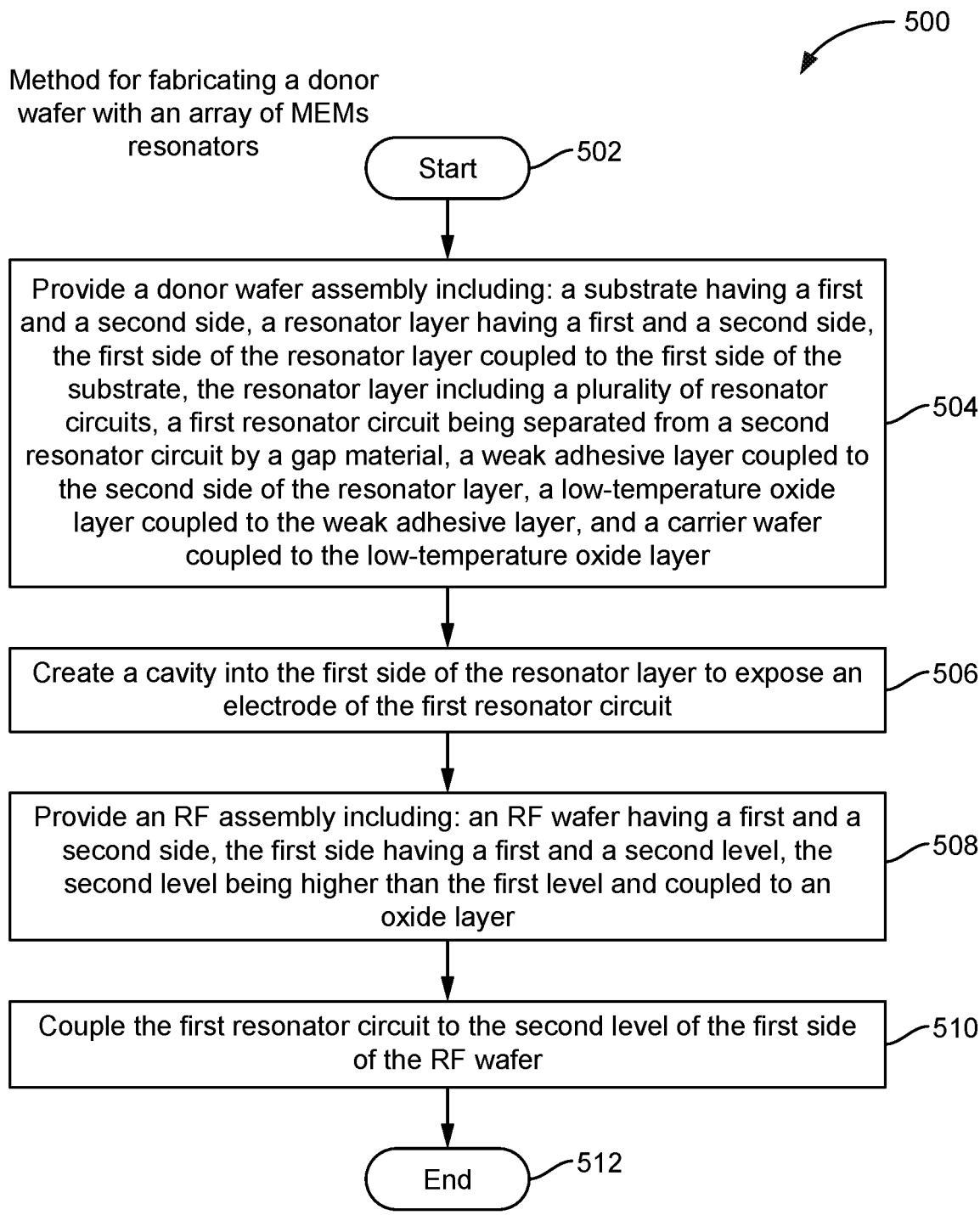
FIG. 5 is a flow diagram that illustrates a method for forming a micro-electromechanical systems (MEMS) resonator and coupling it with an RF wafer in accordance with some embodiments.

FIG. 5 is a flow chart to illustrate a method 500 for forming a MEMS resonator and coupling it with an RF wafer in accordance with various embodiments. FIGS. 6A-6H schematically illustrate a cross-sectional side view of an IC structure 600 at various stages of the method 500, in accordance with various embodiments. Accordingly, the method 500 will be described below with reference to FIGS. 6A-6H. Similar fabrication principles to those described herein may be used to form IC structures with other configurations than that shown in FIGS. 6A-6H.

At block 502, the method 500 may start.

At block 504, the method 500 may provide a donor wafer assembly including: a substrate having a first and a second side, a resonator layer having a first and a second side, the first side of the resonator layer coupled to the first side of the substrate, the resonator layer including a plurality of resonator circuits, a first resonator circuit being separated from a second resonator circuit by a gap material, a weak adhesive layer coupled to the second side of the resonator layer, a low-temperature oxide layer coupled to the weak adhesive layer, and a carrier wafer coupled to the low-temperature oxide layer.

Figure 6A:
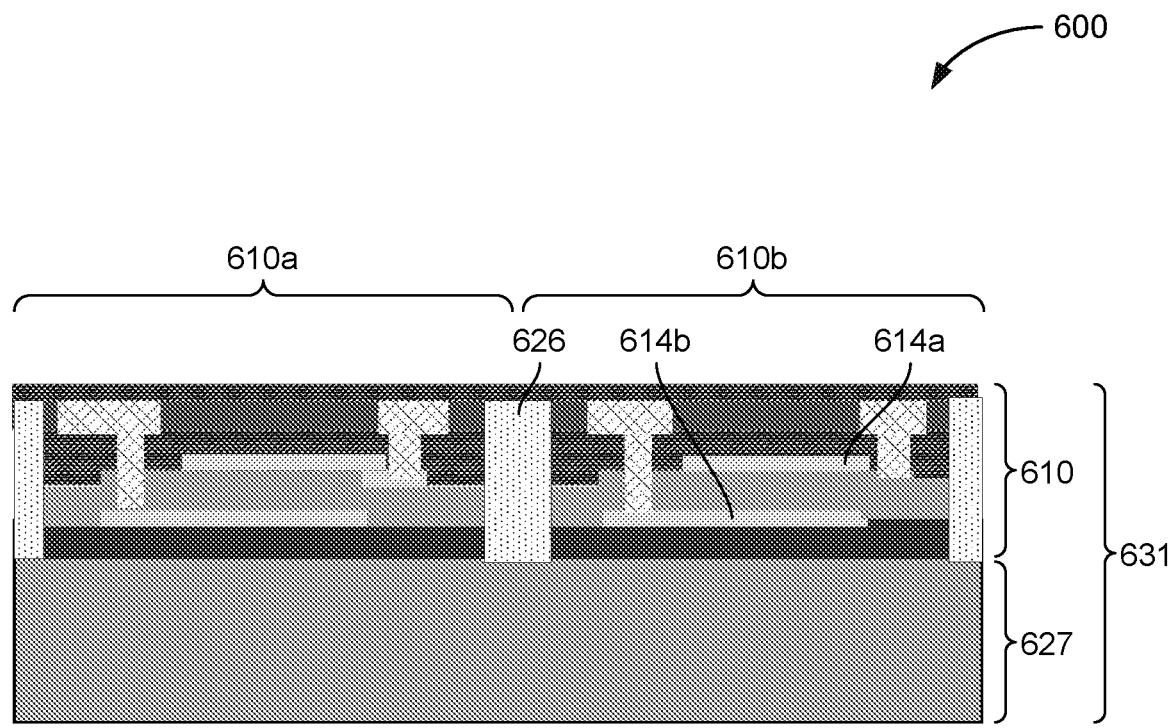
FIGS. 6A-6H schematically illustrate a cross-section side view of various stages of the method of FIG. 5, in accordance with some embodiments.

In embodiments, FIG. 6A illustrates a donor wafer assembly 631 that may include a substrate 627 having a first and a second side, a resonator layer 610, according to some embodiments, which may be similar to the resonator 310 of FIG. 3. The first side of the resonator layer 610 may be coupled to the first side of the substrate 628, the resonator layer 610 may include a plurality of resonator circuits, 610a and 610b. A first resonator circuit 610a may be separated from a second resonator circuit 610b by a gap material 626, which may be similar to the gap material 326 of FIG. 3.

In embodiments, a gap material 626 may be a weak cohesive material such as many low k inter-level dielectric, ILD materials or porous materials. In embodiments, the gap may be created by conventional litho/etch and then filled with low k ILD or spin on material. The excess material may be removed via standard processing. The gap material may be thermally decomposable also prior to bonding or during bonding.

Figure 6B:
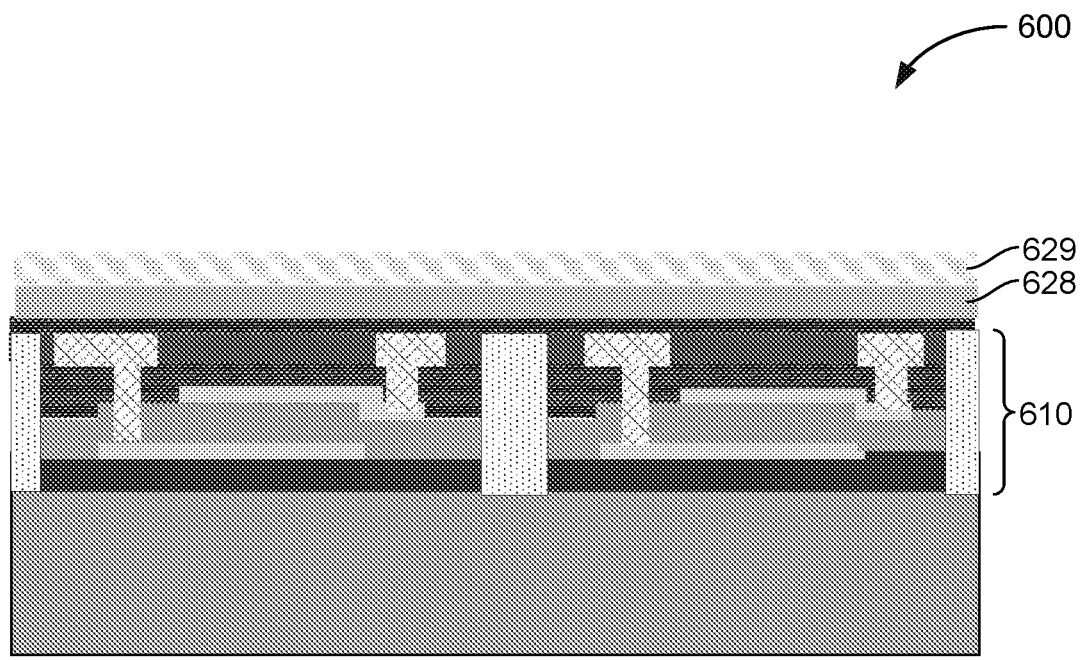

FIG. 6B illustrates a donor wafer assembly 631 that may include a weak adhesive layer 628 coupled to the second side of the resonator layer 610, according to some embodiments. A low-temperature oxide layer 629 may be coupled to the weak adhesive layer 628.

In embodiments, the material in the weak adhesive layer 628 and low temperature oxide layer 629 may provide temporary adhesion and then a subsequent release during the bonding process such that the bonding layer silicon is stronger than the weak interface. In embodiments, the weak adhesive layer may be a noble metal without any adhesive such as gold. In embodiments, copper without adhesive layer may also be used. In embodiments, a thermally decomposable material may be used, for example one that decomposes between 300 and 400 degrees Celsius as a non-limiting example. In embodiments, porous dielectric may be used. In embodiments, a light-activated process may be used through the backside of the carrier substrate when the carrier substrate is transparent to the wavelength of light used.

Figure 6C:
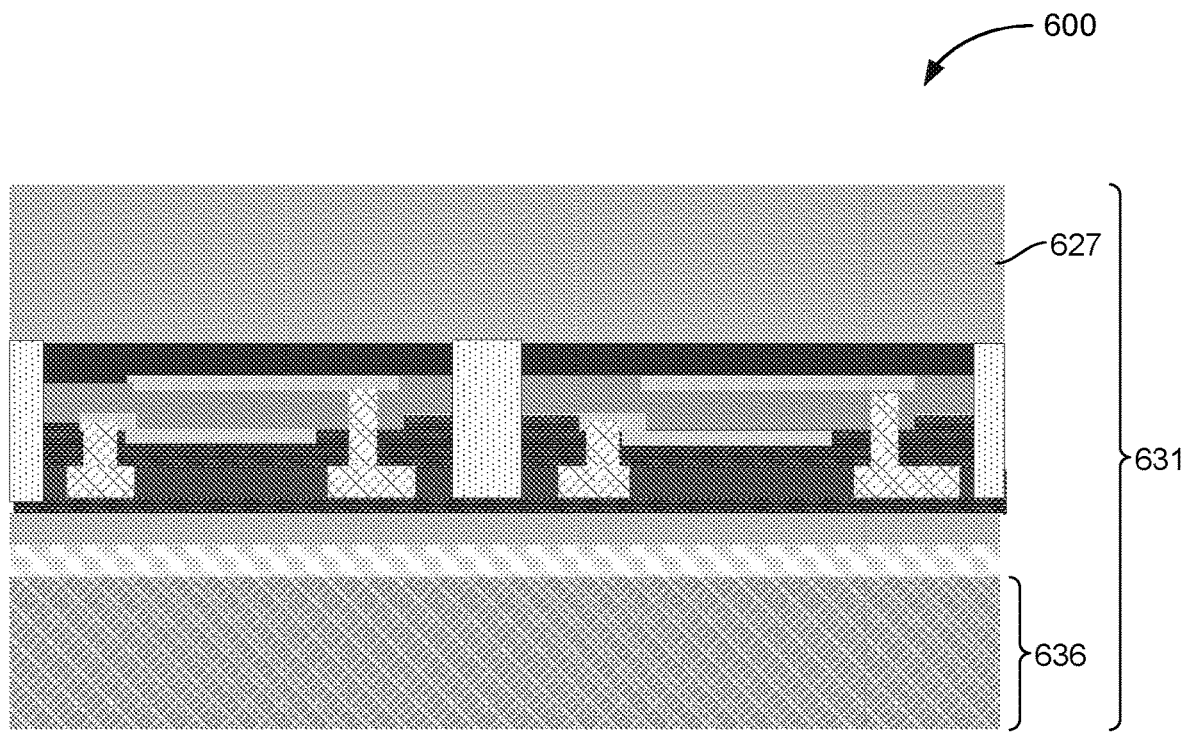

FIG. 6C illustrates a donor wafer assembly 631 that may include a carrier wafer 636 that may be coupled to a weak adhesive layer 628, according to some embodiments. In embodiments, the carrier wafer may be silicon or glass.

Figure 6D:
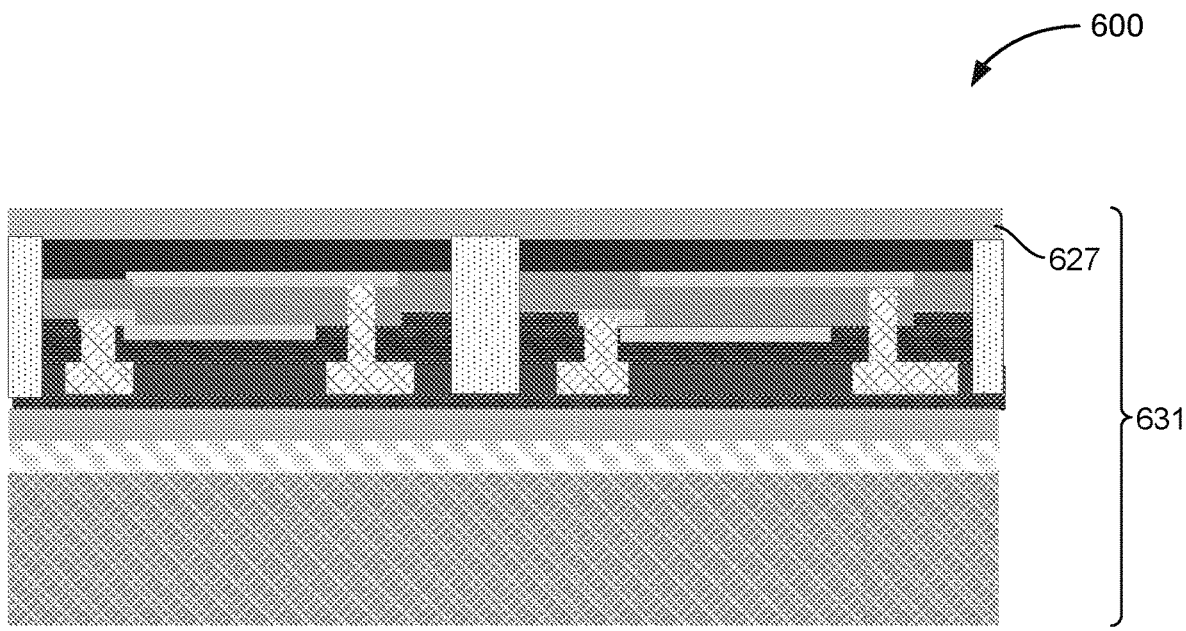

FIG. 6D illustrates a donor wafer assembly 631 that may include the substrate 627 being reduced in thickness. In some embodiments, the substrate 627 may be removed entirely. In embodiments, the substrate may be reduced in thickness through grinding and/or through some other thinning process such as etching and/or chemical mechanical planarization (CMP).

Returning to FIG. 5, at block 506, the method 500 may create a cavity into the first side of the resonator layer to expose an electrode of the first resonator circuit. A cavity may be patterned on the surface of the wafer to define the bottom membrane of the filter by legacy lithography and etching processes. In conventional MEMS devices, this cavity is typically the last process step and may be done from the backside of the wafer or by an undercut process.

Figure 6E:
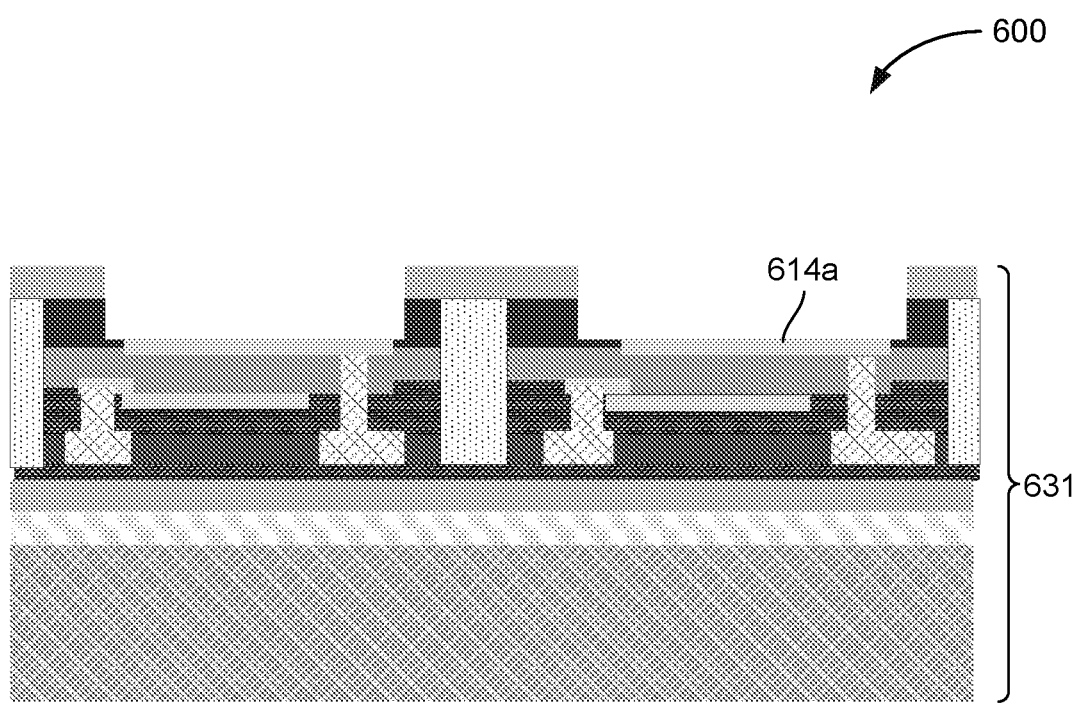

FIG. 6E illustrates a donor wafer assembly 631 that may include an etched cavity 617 exposing an electrode 614a.

Returning to FIG. 5, at block 508, the method 500 may provide an RF assembly including: an RF wafer having a first side and a second side, the first side having a first and the second level, the second level being higher than the first level and coupled to an oxide layer.

Figure 6F:
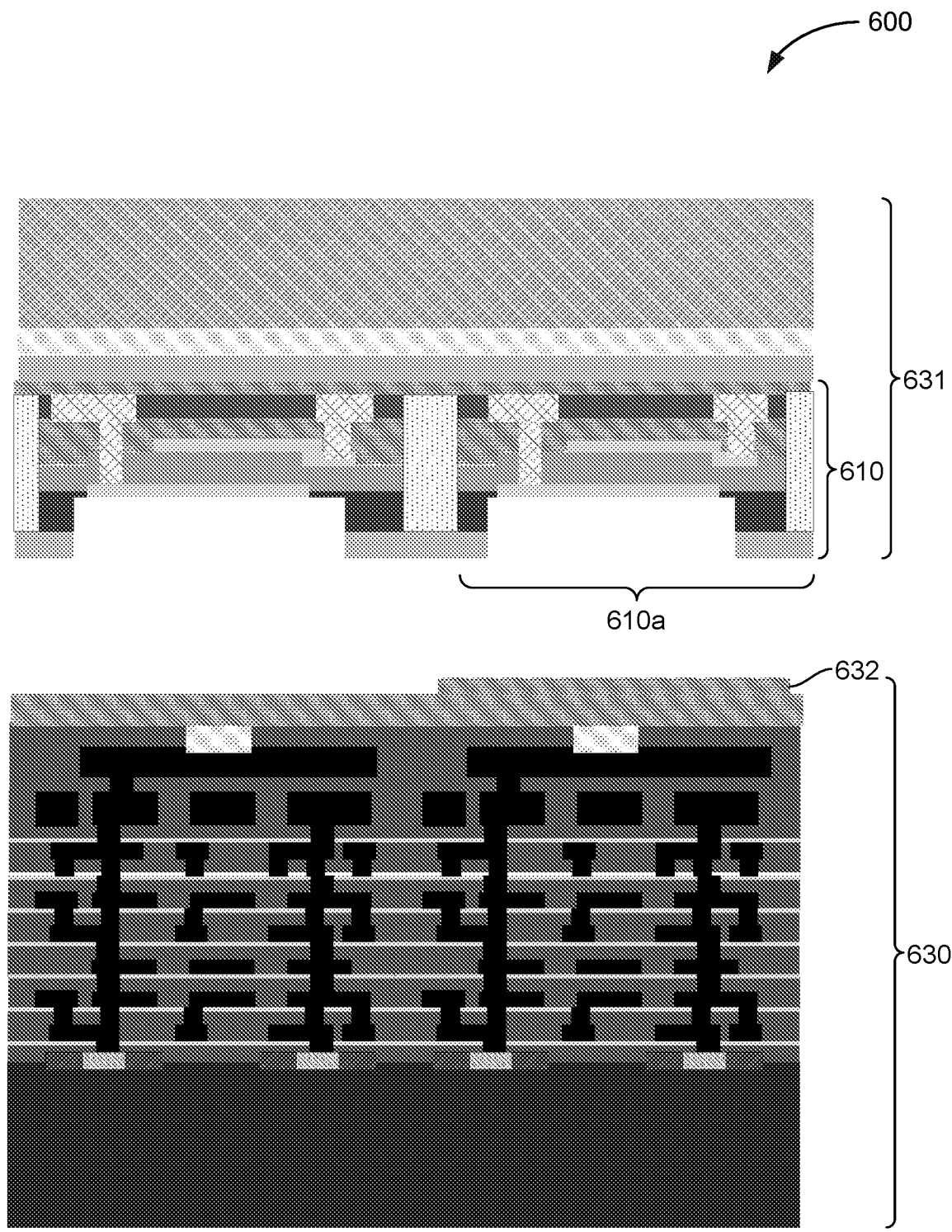

FIG. 6F illustrates a donor wafer assembly 631 that has been positioned above an RF wafer 630. The resonator layer 610 has been aligned so that a resonator 610a is positioned above the oxide mesa 632 of RF wafer 630.

Returning to FIG. 5, at block 510, the method 500 may couple the first resonator circuit to the second level of the first side of the RF wafer.

Figure 6G:
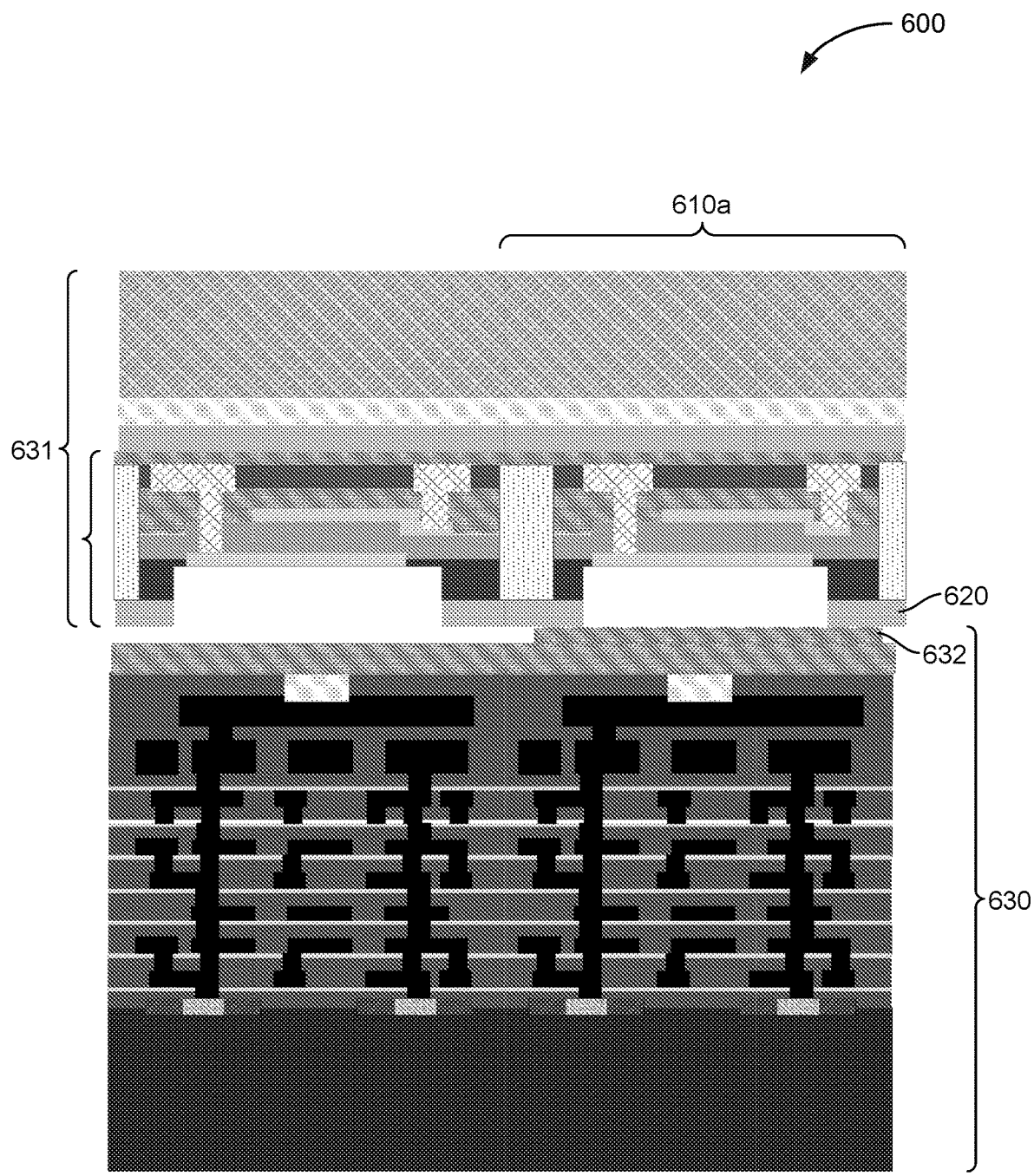

FIG. 6G illustrates a donor wafer assembly 631 that has been bonded to an RF wafer, according to some embodiments. RF layer 630, which includes oxide mesa 632, is coupled to the silicon layer 220 of the resonator circuit 610a.

Figure 6H:
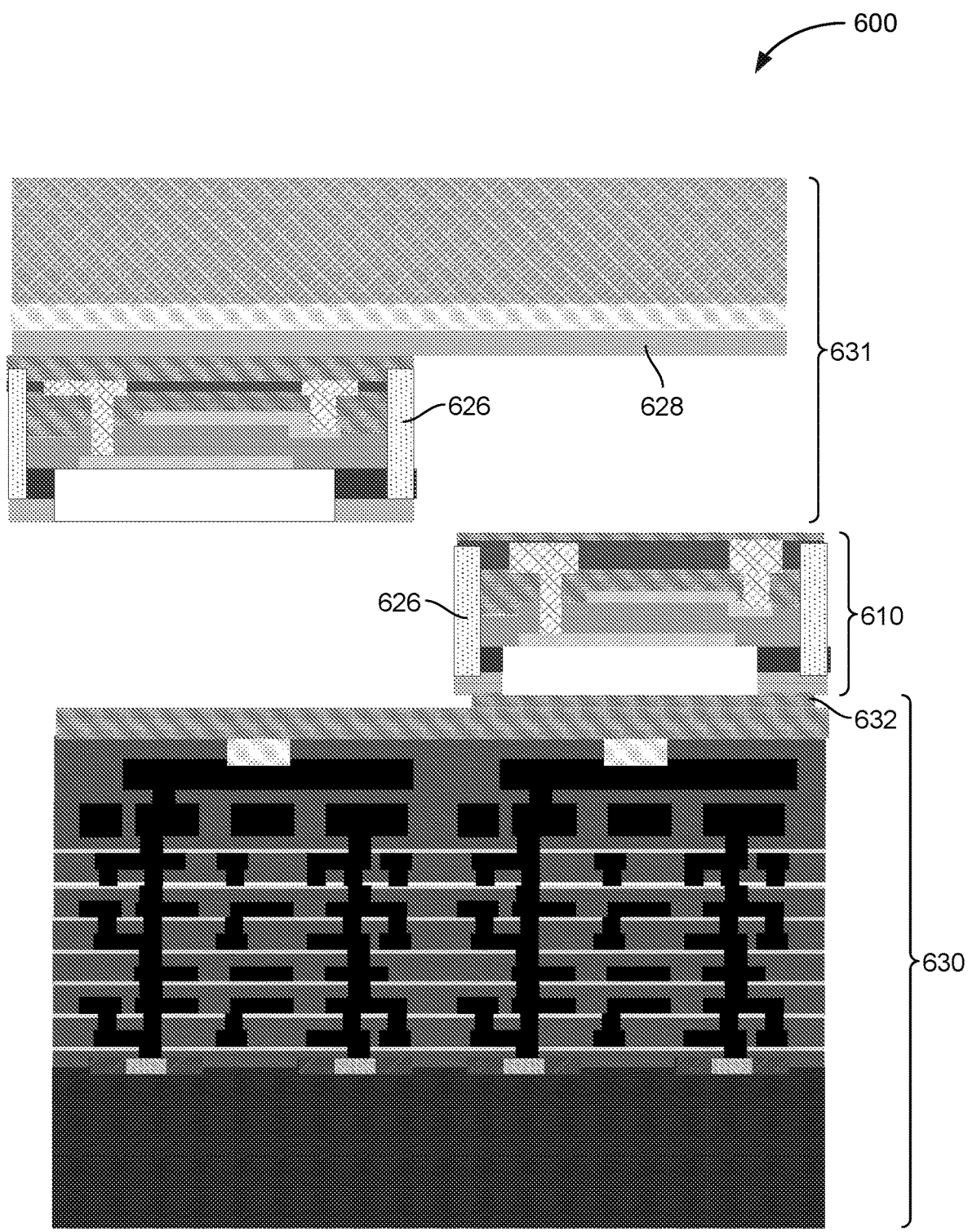

FIG. 6H illustrates the donor wafer assembly 631 being removed from the RF wafer and the resonator circuit 610a that continues to be coupled to the oxide mesa area 632. In embodiments, as the donor wafer 631 is removed, the resonator circuit 610a that is bonded to the RF wafer 630 remains attached to the oxide mesa 632, and is detached from the donor wafer assembly 631. In embodiments, the resonator circuit 610a is detached at the point of the gap material 626 and also at the point of the weak adhesive layer 628.

Figure 7:
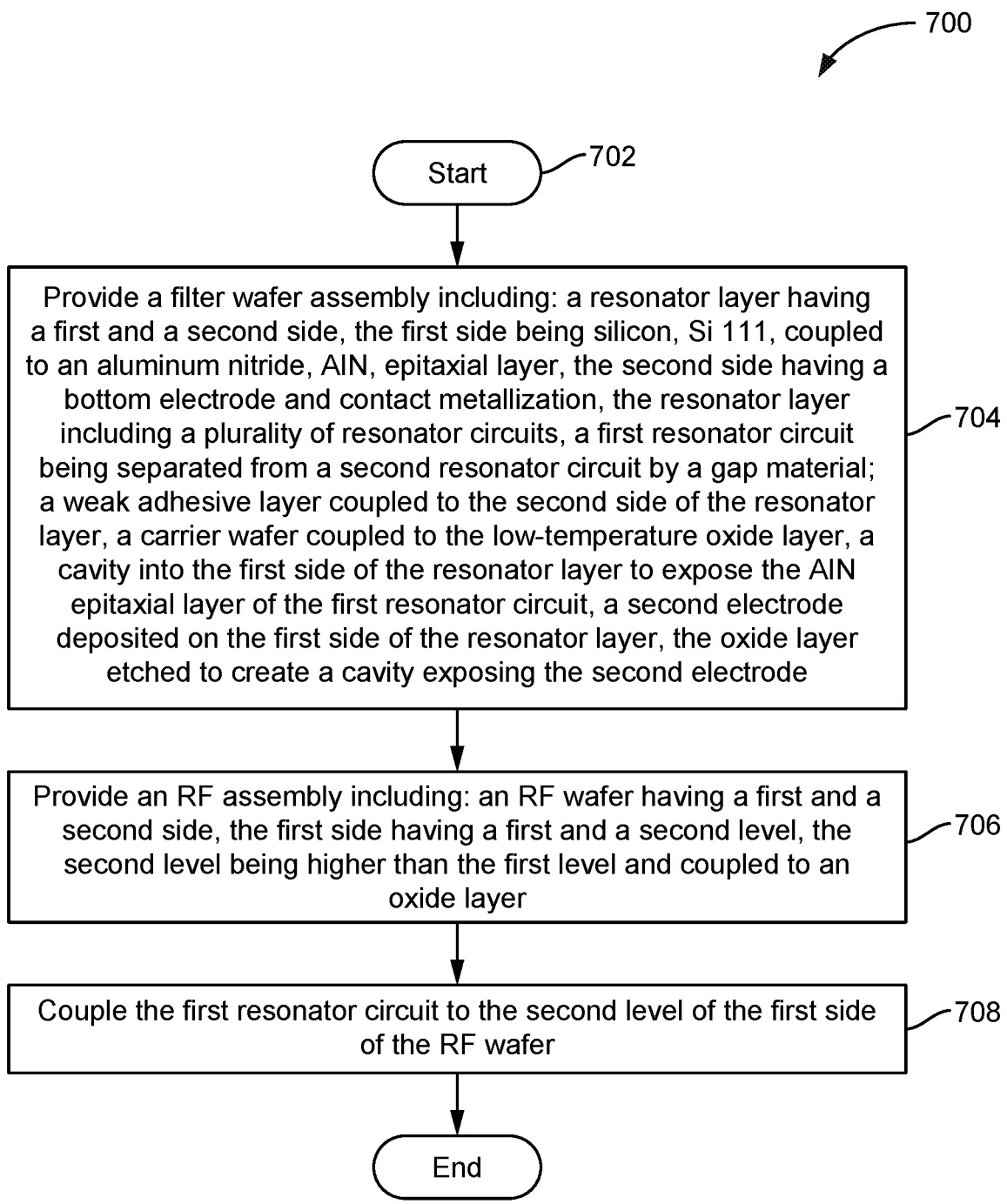
FIG. 7 is a flow diagram for illustrating a method for using an epitaxial grown layer to form a resonator circuit, in accordance with some embodiments.

FIG. 7 is a flow chart to illustrate a method 700 for forming a MEMS resonator and coupling it with an RF wafer in accordance with various embodiments. FIGS. 8A-8J schematically illustrate a cross-sectional side view of an IC structure 800 at various stages of the method 700, in accordance with various embodiments. Accordingly, the method 700 will be described below with reference to FIGS. 8A-8J. Similar fabrication principles to those described herein may be used to form IC structures with other configurations than that shown in FIGS. 8A-8J.

At block 702, the method 700 may start.

At block 704, the method 700 may provide a filter wafer assembly including: a resonator layer having a first and a second side, the first side including an epitaxial layer (e.g., aluminum nitride, AlN) coupled to a substrate (e.g., silicon, Si 111), the second side having a bottom electrode and contact metallization, the resonator layer including a plurality of resonator circuits, a first resonator circuit being separated from a second resonator circuit by a gap material; a weak adhesive layer coupled to the second side of the resonator layer, a low-temperature oxide layer coupled to the weak adhesive layer, a carrier wafer coupled to the low-temperature oxide layer, a cavity extending into the first side of the resonator layer to expose the epitaxial layer of the first resonator circuit, a second electrode deposited at the bottom of the cavity, an oxide spacer layer deposited on the first side of the resonator layer, the oxide spacer layer etched to create a cavity exposing the second electrode.

Figure 8A:
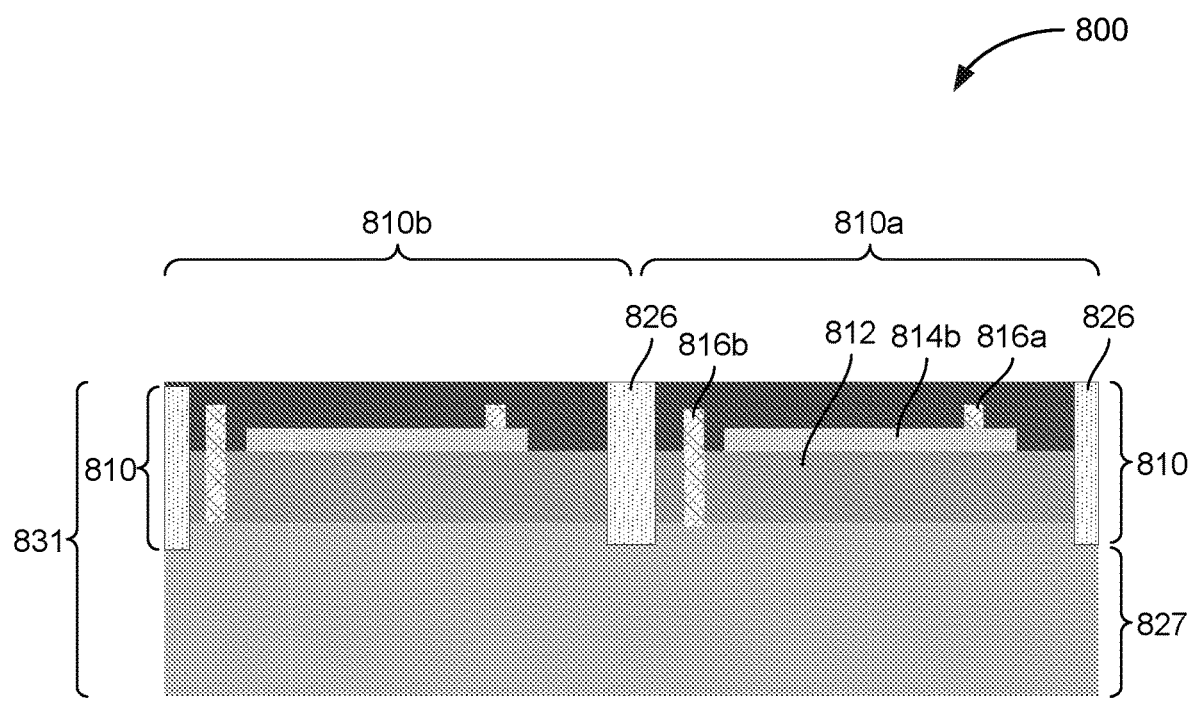
FIGS. 8A-8J schematically illustrate a cross-section side view of an IC structure during various stages of the method of FIG. 7, in accordance with some embodiments.

In embodiments, FIG. 8A illustrates a donor wafer assembly 831 that may have a substrate 827 having a first and a second side, and a resonator layer 810, according to some embodiments, which may be similar to the resonator 310 of FIG. 3. The first side of the resonator layer 810 may be coupled to the first side of the substrate 827. As shown, the epitaxial layer may be coupled to the substrate 827, and a portion of the substrate 827 is included in the resonator layer 810. The resonator layer 810 may include a plurality of resonator circuits 810a and 810b. The first resonator circuit 810a may be separated from a second resonator circuit 810b by a gap material 826, which may be similar to the gap material 326 of FIG. 3. In embodiments, the substrate 827 may be made of silicon, SI 111, and may be coupled to an epitaxial layer 812 (e.g., an aluminum nitride, AlN, epitaxial layer). Adjacent to the epitaxial layer 812, the resonator layer 810 may include an electrode 814b that may be connected to a contact metallization 816a. A second contact metallization 816b may extend through the AlN layer 812 into the substrate 827.

Figure 8B:
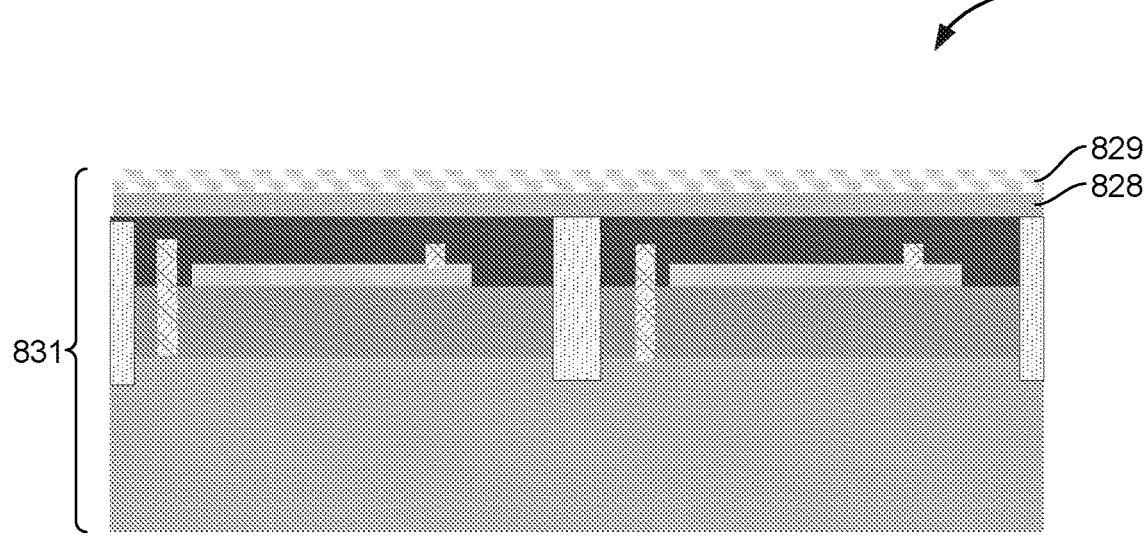

FIG. 8B illustrates a donor wafer assembly 831 that may include a weak adhesive layer 828 coupled to the second side of the resonator layer 810, according to some embodiments. A low-temperature oxide layer 829 may be coupled to the weak adhesive layer 828.

Figure 8C:
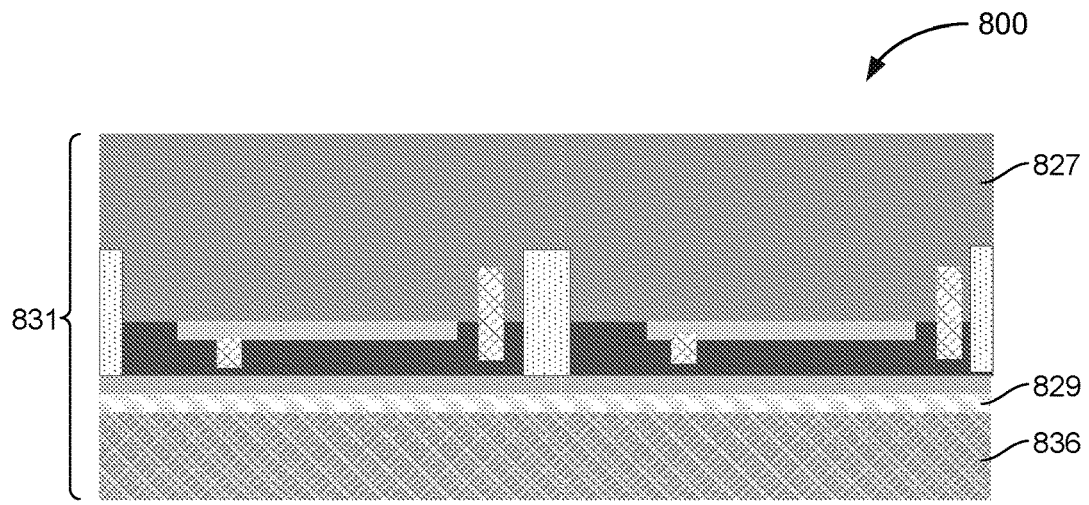

FIG. 8C illustrates a donor wafer assembly 831 (now inverted) that may include a temporary carrier 836 attached to the low-temperature oxide layer 829. In embodiments, the temporary carrier 836 may be silicon or glass, and may be mechanically strong and compatible with fabrication processing. In embodiments, the glass may have an indium tin oxide (ITO) conductive layer to help with e-chucking that may be used on fab tools.

Figure 8D:
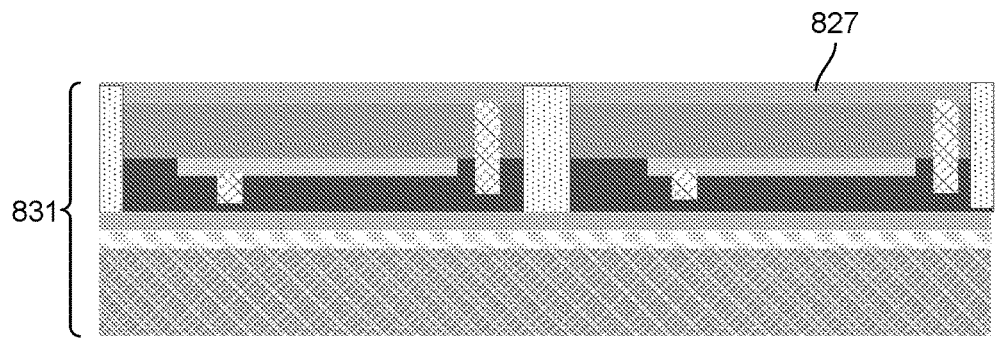

FIG. 8D illustrates a donor wafer assembly 831 that may include the substrate 827 being reduced in thickness. In embodiments, the substrate 827 may be removed entirely. In embodiments, the substrate may be reduced in thickness through grinding and/or through some other thinning process such as etching and/or CMP.

Figure 8E:
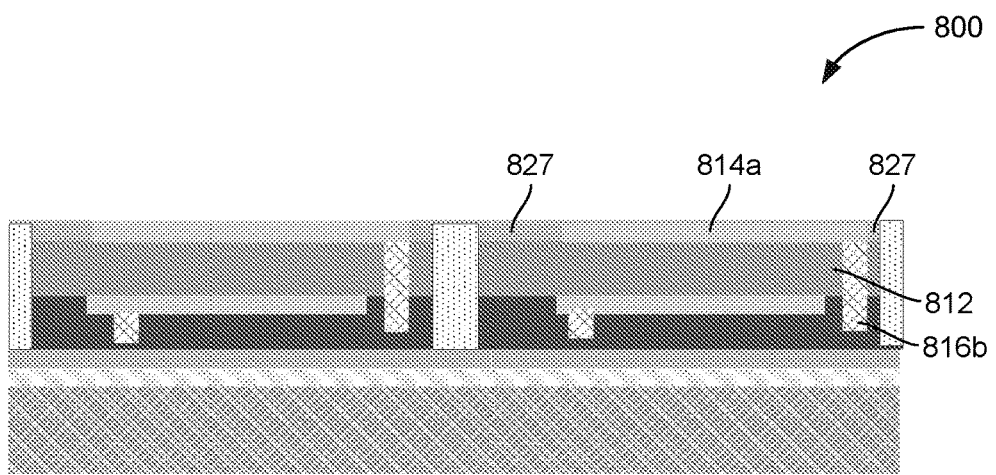

FIG. 8E illustrates a donor wafer assembly 831 where the thinned substrate 827 may be etched to expose the AlN layer 812. In embodiments, some and/or all of the etched areas may be filled to form a bottom electrode 814a. In embodiments, the electrode 814a may be connected to the contact 816b.

Figure 8F:
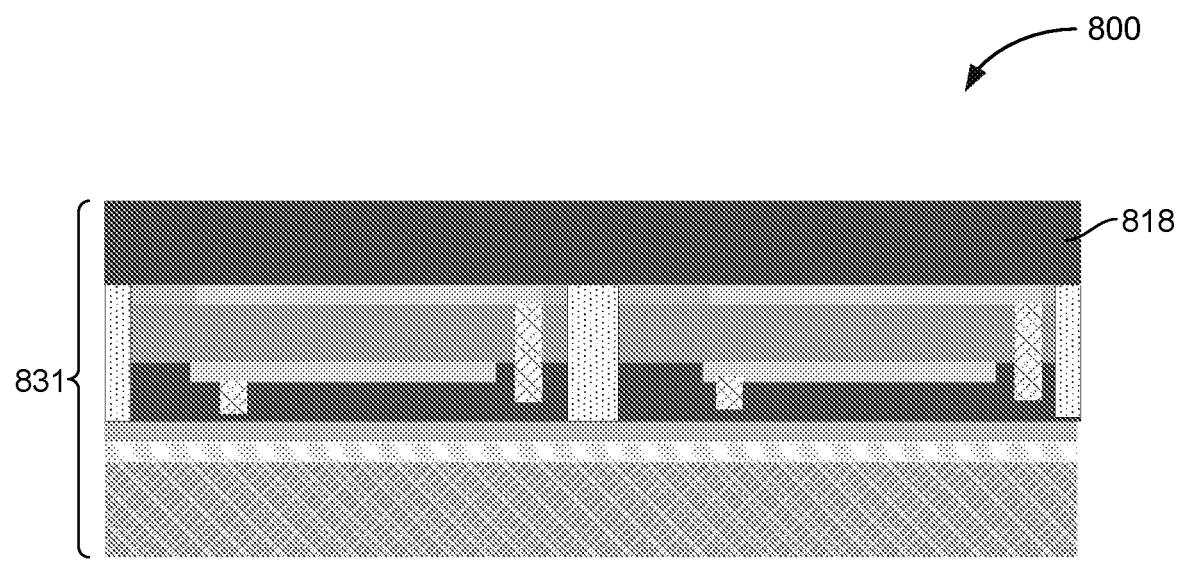

FIG. 8F illustrates a donor wafer assembly 831 that may include an oxide spacer layer 818 deposited on the first side of the resonator layer.

Figure 8G:
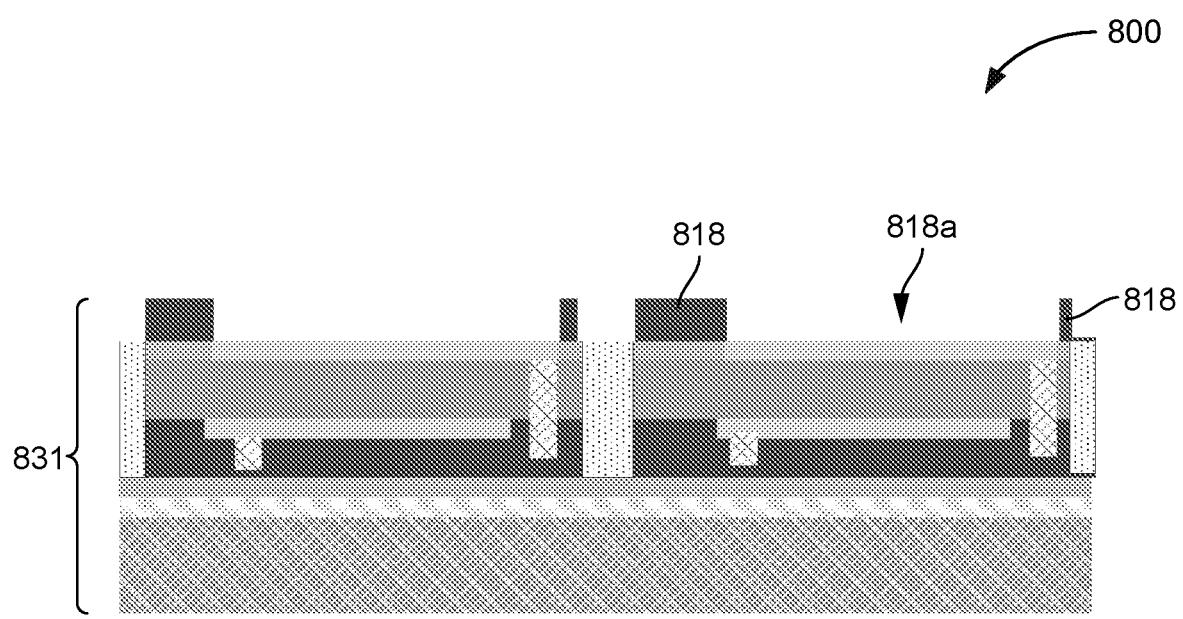

FIG. 8G illustrates a donor wafer assembly 831 that may include an etching of the oxide spacer layer 818 leaving a cavity 818a.

Returning to FIG. 7, at block 706, the method 700 may provide an RF assembly including: an RF wafer having a first and a second side, the first side having a first level and a second level, the second level being higher than the first level and coupled to an oxide layer.

Figure 8H:
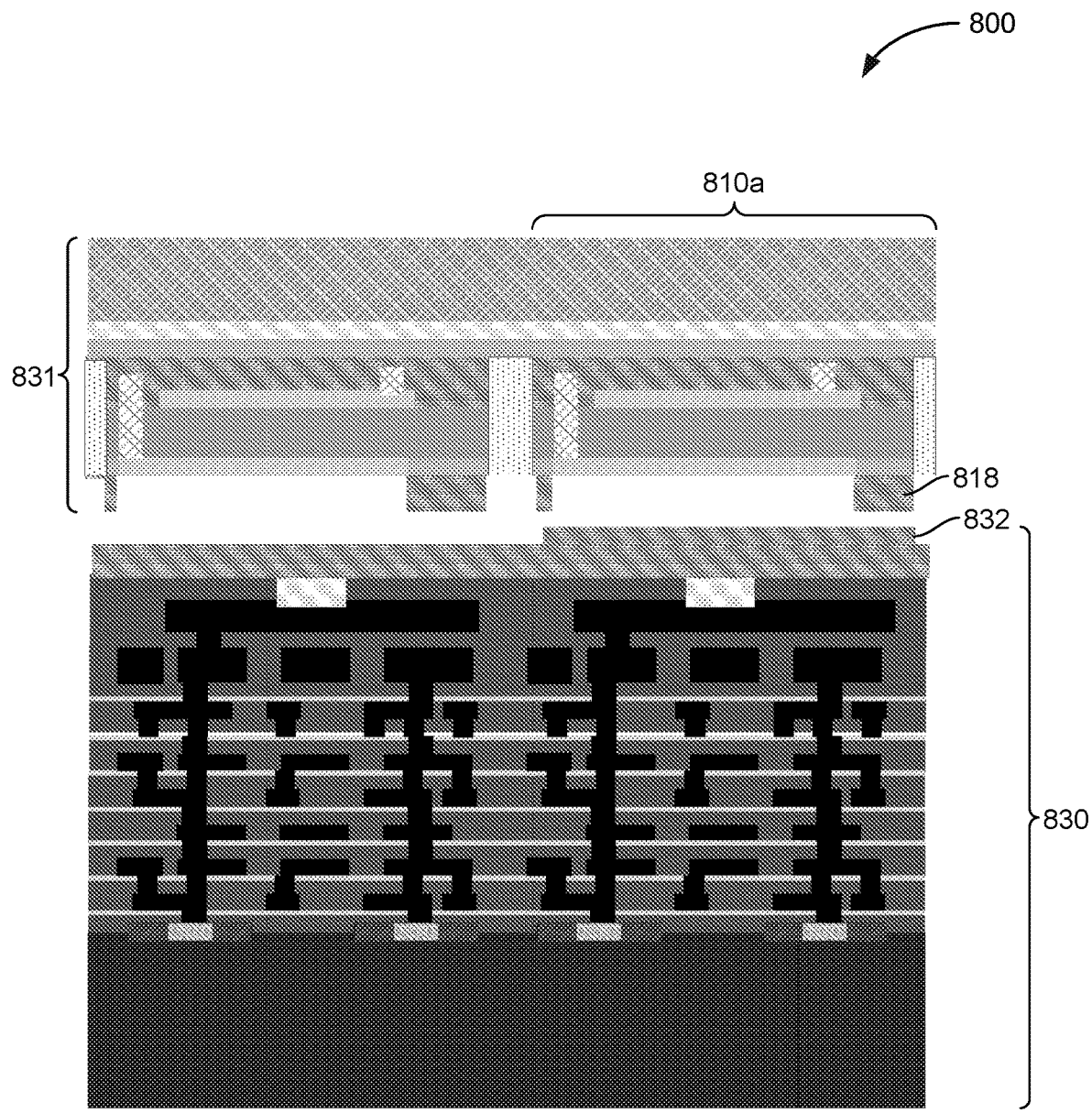

FIG. 8H illustrates a donor wafer assembly 831 (which has been flipped from the previous figure), and an RF wafer 830. The RF wafer 830 includes a first side having a second level 832 (mesa) that is higher than the first level and forming a mesa, to which the oxide layer 818 may attach. In embodiments, the oxide layer 818 of a resonator circuit 810a may be aligned with the mesa 832 prior to coupling and fusing.

Returning to FIG. 7, at block 708 the method 700 may couple the first resonator circuit to the second level of the first side of the RF wafer.

Figure 8I:
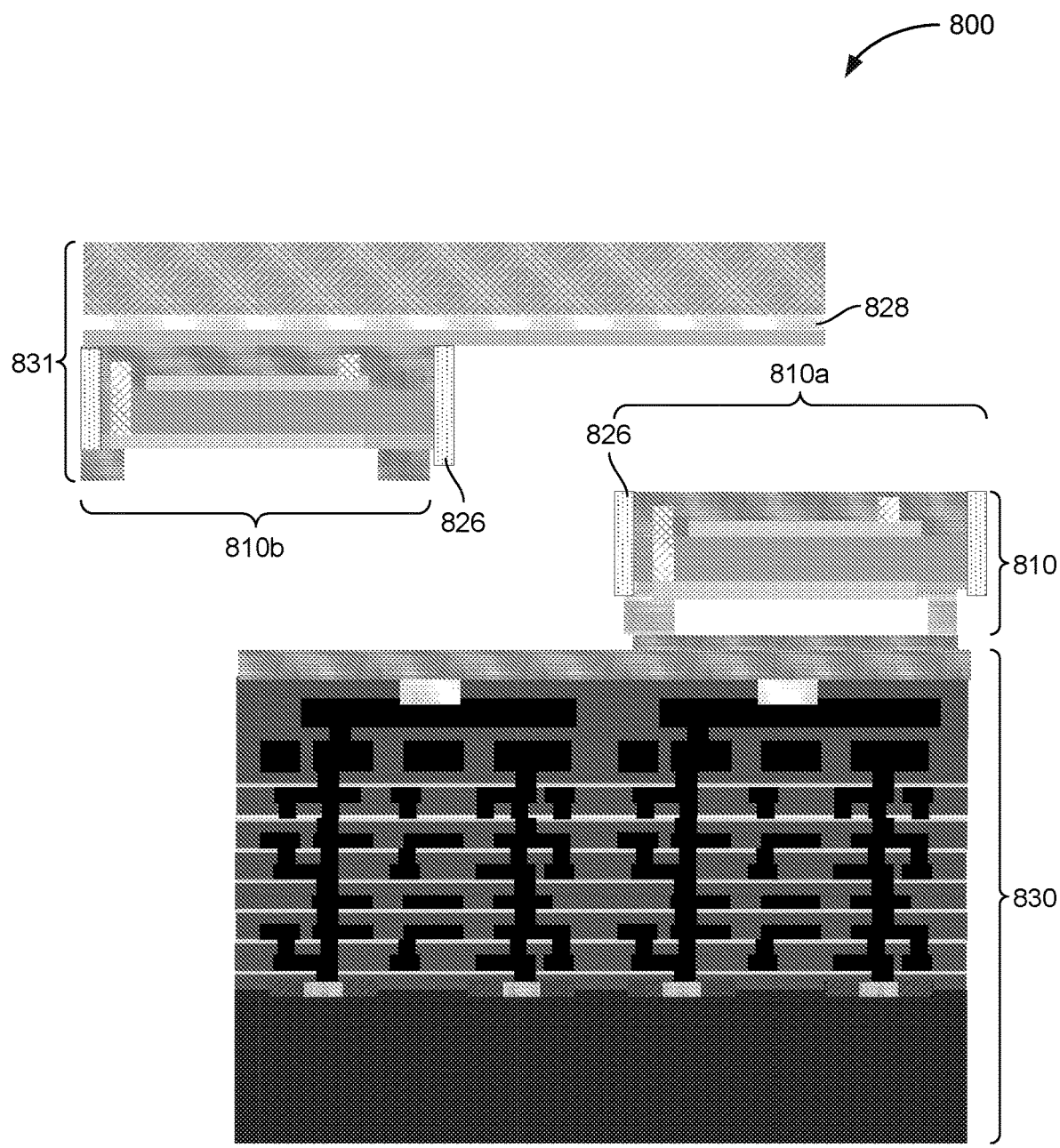

FIG. 8I illustrates a resonator circuit 810a that may have been coupled and/or fused to the RF wafer 830. In embodiments, this may include an oxide to oxide bonding process. In non-limiting examples, two flat clean oxide surfaces that come into contact with each other with pressure/time/temperature will fuse forming a strong bond. Other bonding embodiments may include, titanium-titanium, copper-copper, or other suitable metal. In embodiments, an epoxy or benzocyclobutene (BCB) may be used for bonding, depending on the downstream processing.

After coupling and/or fusing, when the donor wafer 831 is removed, the resonator circuit 810a may break away from the donor circuit 831 at the point of the gap material 826, and the weak adhesive material 828. At this point, the donor wafer 831 is now available to deposit another resonator 810b at another location (e.g., to another RF host circuit on the same wafer or a different wafer).

Figure 8J:
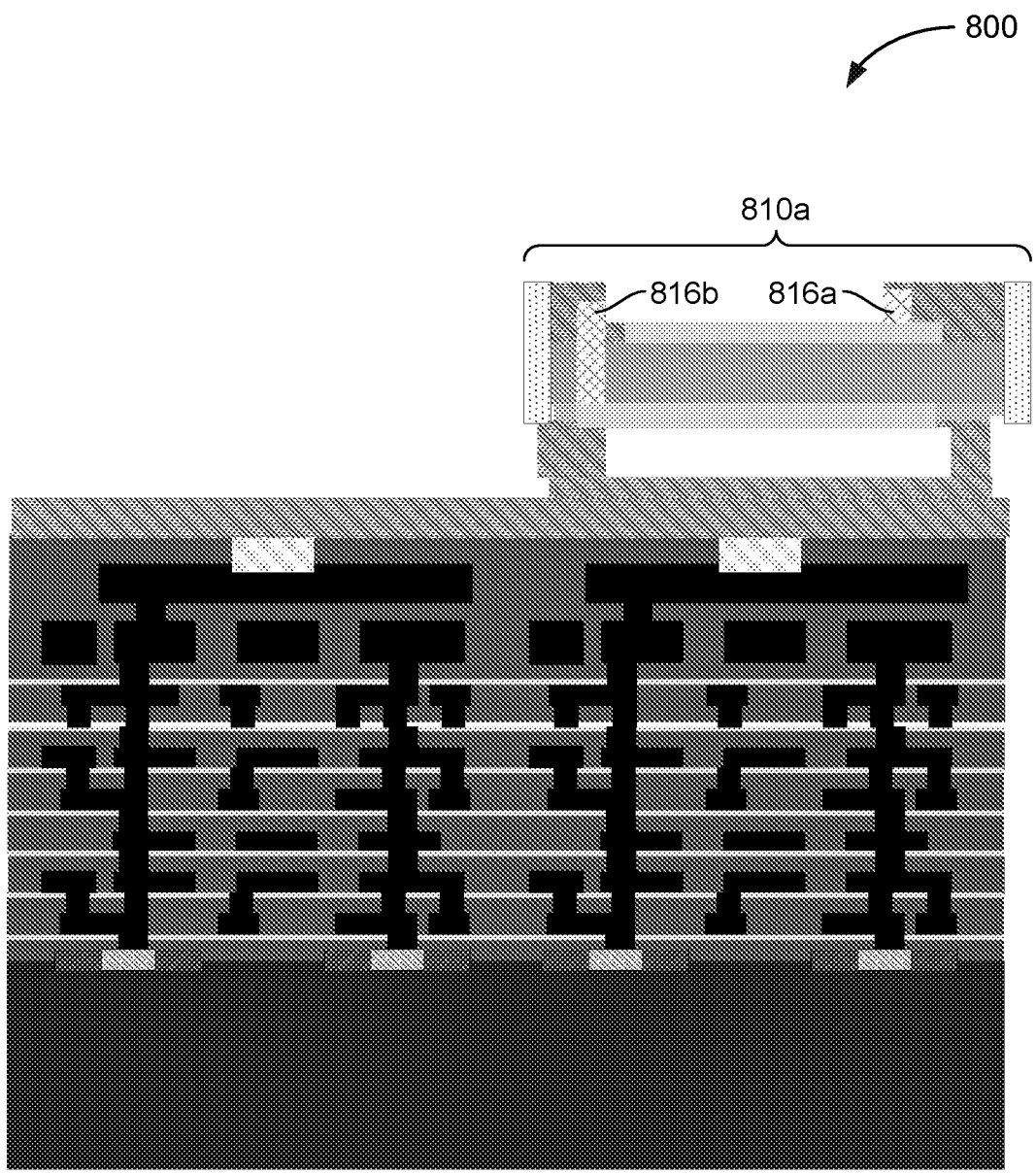

FIG. 8J illustrates removal of material in the resonator 810a, that may expose contact points 816a and 816b and create a cavity. The attached resonator 810a may also be referred to as an island.

Figure 9:
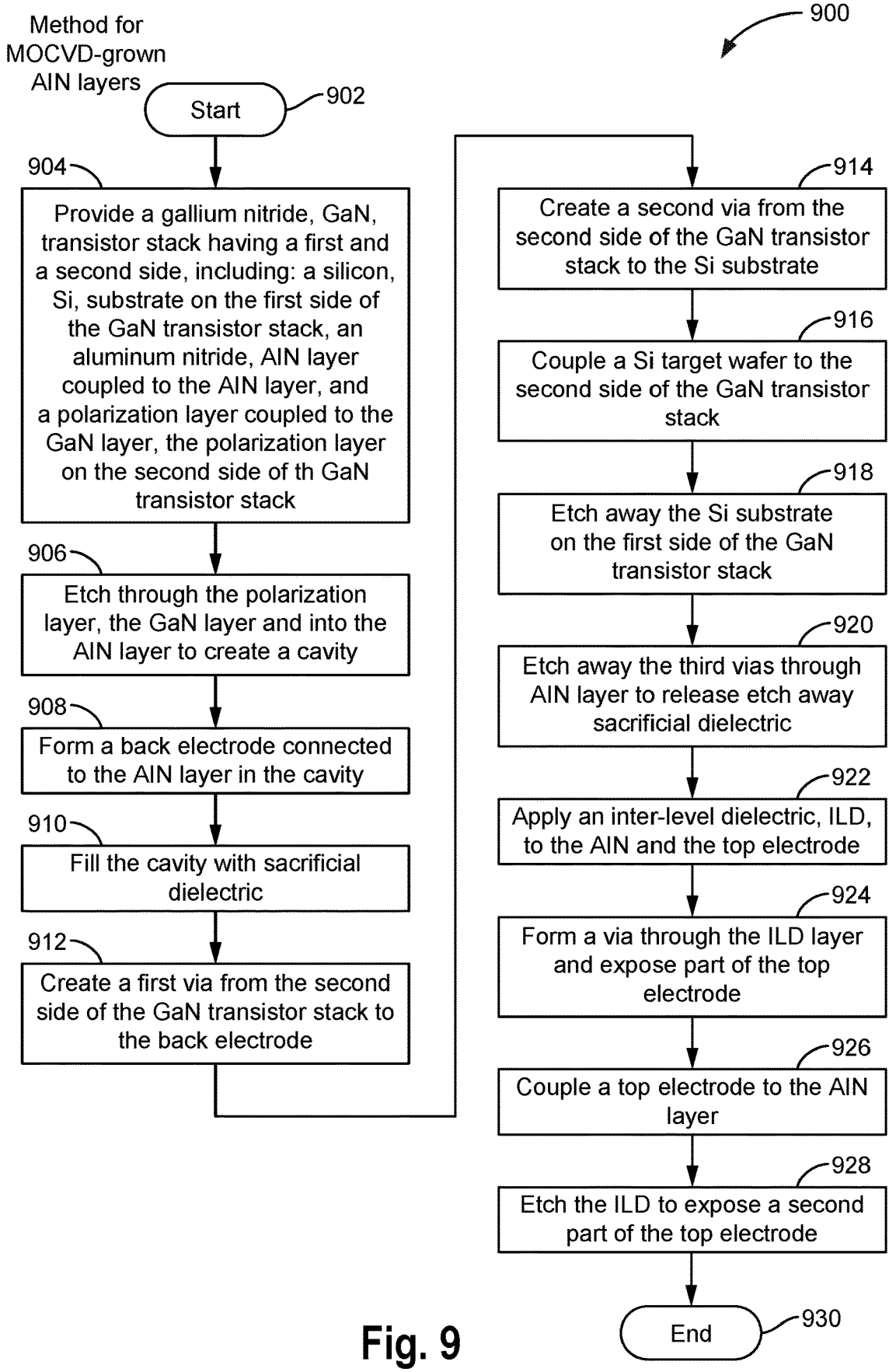
FIG. 9 is a flow diagram for illustrating a method for using metal organic chemical vapor phase deposition (MOCVD)-grown aluminum nitride (AlN) layers to form a resonator circuit, in accordance with some embodiments.

FIG. 9 is a flow diagram for illustrating a method 900 for using metal organic chemical vapor phase deposition (MOCVD)-grown aluminum nitride (AlN) layers to form a resonator circuit, in accordance with some embodiments. FIGS. 10A-10G schematically illustrate a cross-section side view of an IC structure 1000 during various stages of the method 900 of FIG. 9, in accordance with some embodiments. Accordingly, the method 900 will be described below with references to FIGS. 10A-10G. Similar fabrication principles to those described herein may be used to form IC structures with other configurations than that shown in FIGS. 10A-10G.

At block 902, the method 900 may start.

At block 904 the method 900 may provide a gallium nitride, GaN, transistor stack having a first side and a second side, including: a substrate (e.g., silicon) on the first side of the GaN transistor stack, an aluminum nitride, AlN layer coupled to the substrate, a GaN layer coupled to the AlN layer, and a polarization layer coupled to the GaN layer, the polarization layer on the second side of the GaN transistor stack.

Figure 10A:
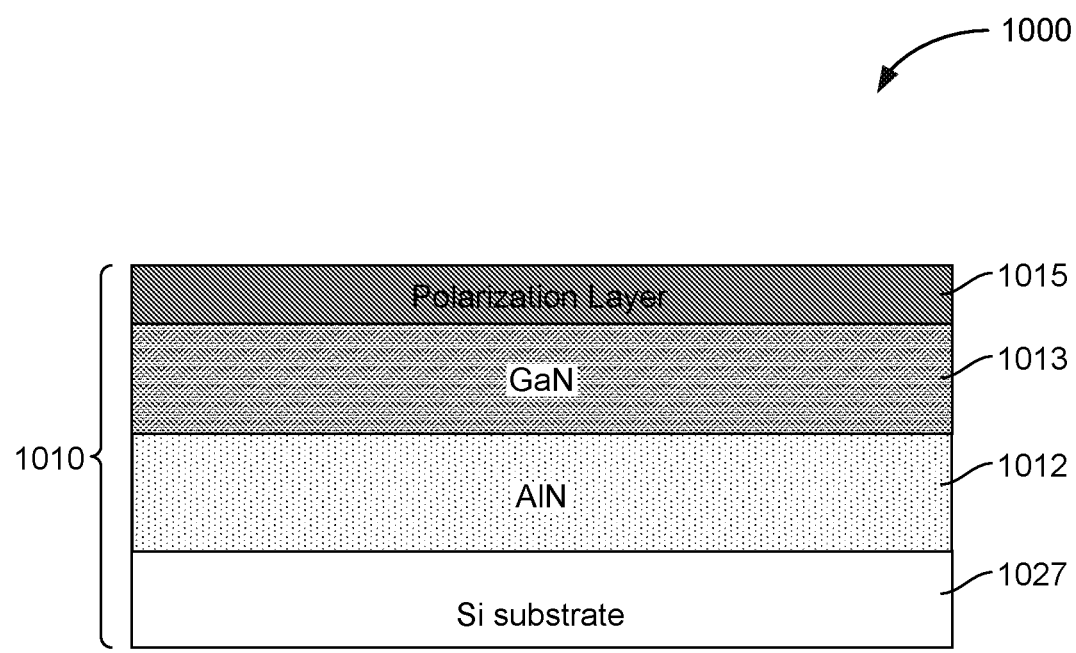
FIGS. 10A-10G schematically illustrate a cross-section side view of an IC structure during various stages of the method of FIG. 9, in accordance with some embodiments.

In embodiments, FIG. 10A illustrates a GaN transistor stack 1010, that includes a SI substrate 1027 that is coupled to an AlN layer 1012. In embodiments, the AlN layer 1012 may be between 0.2 and 1.0 micrometers, μm, in thickness. A GaN layer 1013 may be coupled to the AlN layer 1012, and a polarization layer 1015 may be coupled to the GaN layer 1013. In embodiments, the polarization layer may cause a sheet of charge (electrons) to form in the GaN, which may be referred to as a two-dimensional electron gas (2DEG). In embodiments, the GaN devices may be based off of this 2DEG.

At block 906, the method 900 may etch through the polarization layer, the GaN layer and into the AlN layer to create a cavity.

Figure 10B:
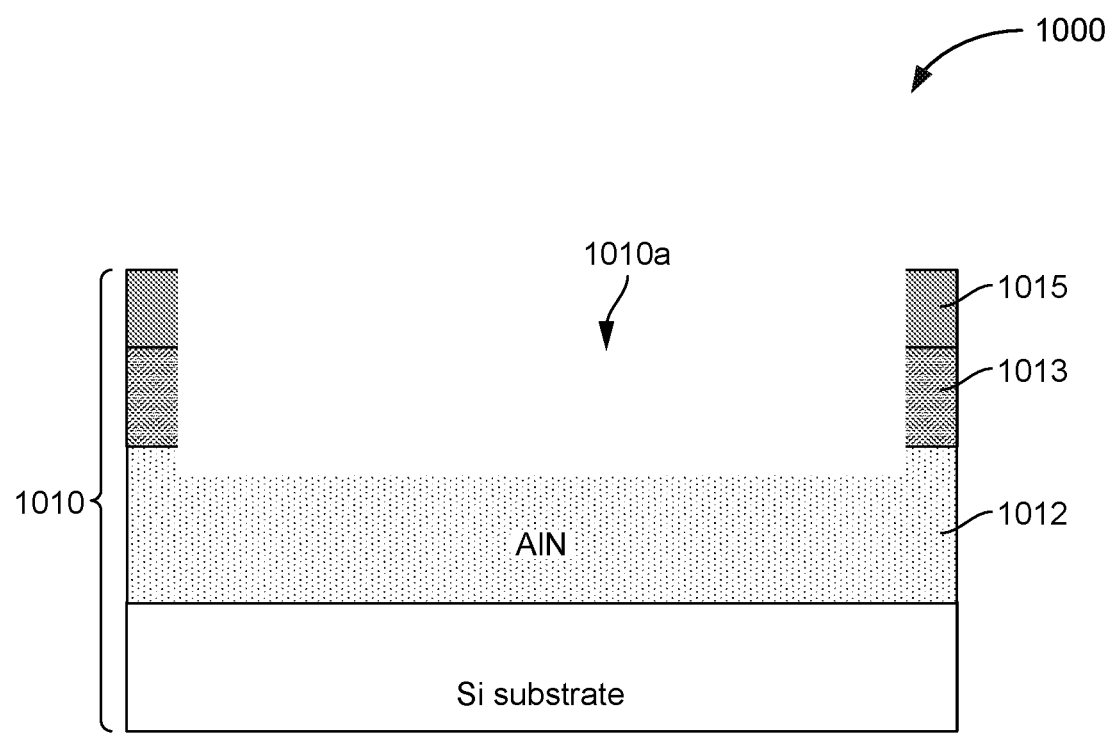

FIG. 10B illustrates a GaN transistor stack 1010 with a cavity 1010a etched through the polarization layer 1015, the GaN layer 1013, and into the AlN layer 1012.

At block 908, the method 900 may form a back electrode connected to the AlN layer in the cavity.

At block 910, the method 900 may fill the cavity with sacrificial dielectric.

At block 912, the method 900 may create a first via from the second side of the GaN transistor stack to the back electrode.

At block 914, the method 900 may create a second via from the second side of the GaN transistor stack to the Si substrate.

Figure 10C:
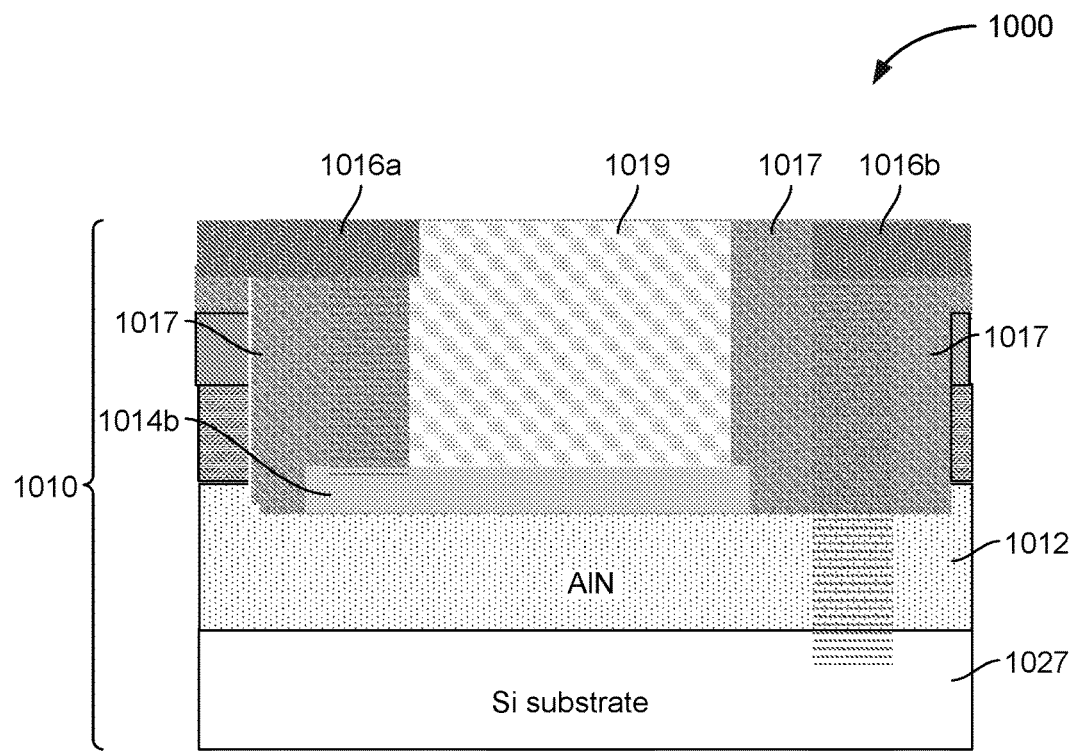

FIG. 10C illustrates a GaN transistor stack 1010 in which the cavity 1010a from FIG. 10B may be filled and may include a back electrode 1014b. The back electrode 1014b may include copper in some embodiments. The back electrode 1014b may be coupled to the AlN layer 1012, a dielectric 1017, a sacrificial dielectric 1019, a first via 1016a that extends through the GaN transistor stack 1010 to the back electrode 1014b, and a second via 1016b that extends through the GaN transistor stack 1010 to the silicon substrate 1027.

FIG. 9, at block 916, the method 900 may couple a Si target wafer to the second side of the GaN transistor stack.

Figure 10D:
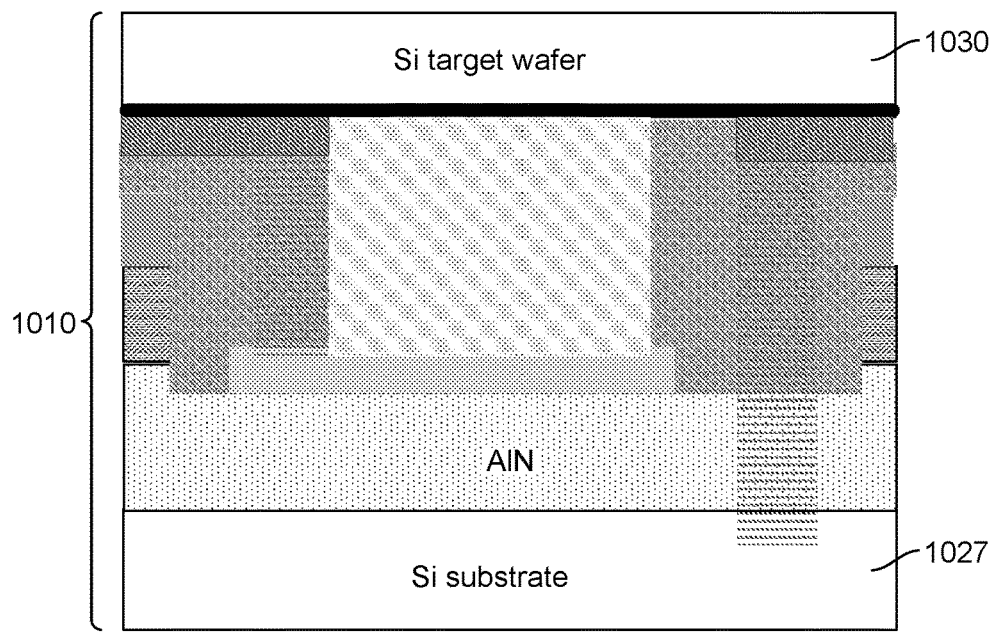

FIG. 10D illustrates a Si target wafer 1030 that is attached to the GaN transistor stack 1010.

FIG. 9, at block 918, the method 900 may etch away the Si substrate on the first side of the GaN transistor stack. At block 920, the method 900 may etch third vias through the AlN layer to etch away sacrificial dielectric.

Figure 10E:
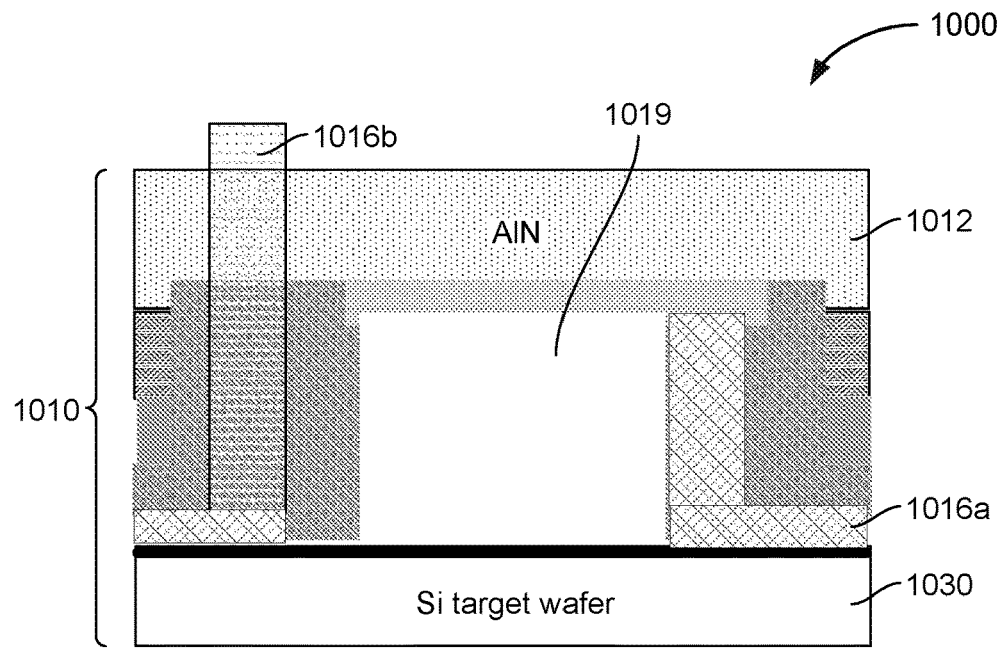

FIG. 10E illustrates a GaN transistor stack 1010 in which the stack may be flipped and the silicon substrate 1027 may be removed. In one non-limiting example, the silicon substrate 1027 may be removed through etching and/or other removal techniques. The AlN layer 1012 may be exposed by the removal of the silicion substrate 1027. The first via 1016a and the second via 1016b may be filled with contact material to create electrodes. The sacrificial dielectric 1019 may be etched away.

FIG. 9, at block 922, the method 900 may apply an ILD to the AlN and the top electrode.

Figure 10F:
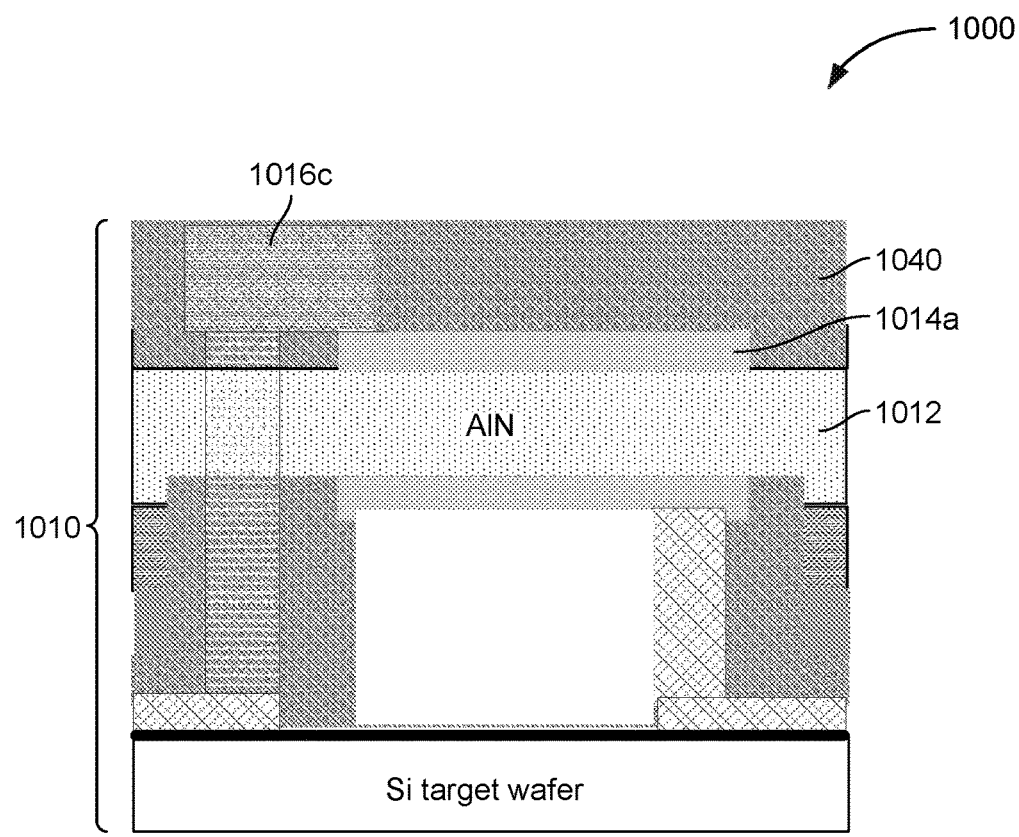
Figure 10G:
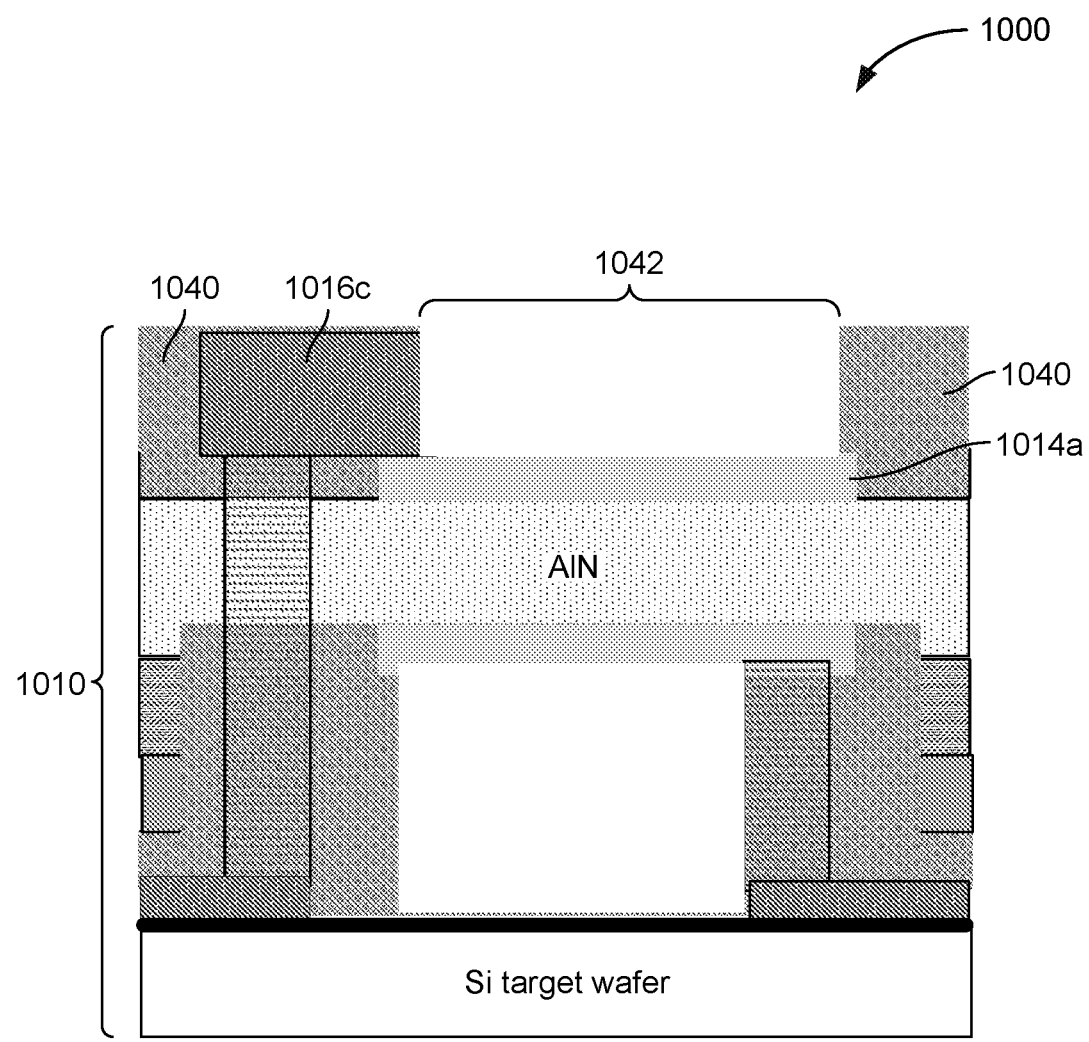

FIG. 10F illustrates a GaN transistor stack 1010 where a second electrode 1014a may be placed on top of the AlN layer 1012. An ILD 1040 may be placed on the second electrode 1014a and/or AlN layer 1012. An additional via 1016c may be created in the ILD layer 1040 and may be adjacent to the electrode 1016b.

FIG. 9, at block 924, the method 900 may form a via through the ILD layer and expose part of the top electrode.

FIG. 10E illustrates a GaN transistor stack 1010 in which a via 1042 may be etched in the ILD layer 1040. In embodiments, the via 1042 may expose the second electrode 1014a.

FIG. 9, at block 926, the method 900 may, in alternative embodiments, couple a top electrode to the AlN layer. At block 928, the method 900, in alternative embodiments, may etch the ILD to expose a second part of the top electrode.

FIG. 9, at block 930, the method 900 may end.

Figure 11:
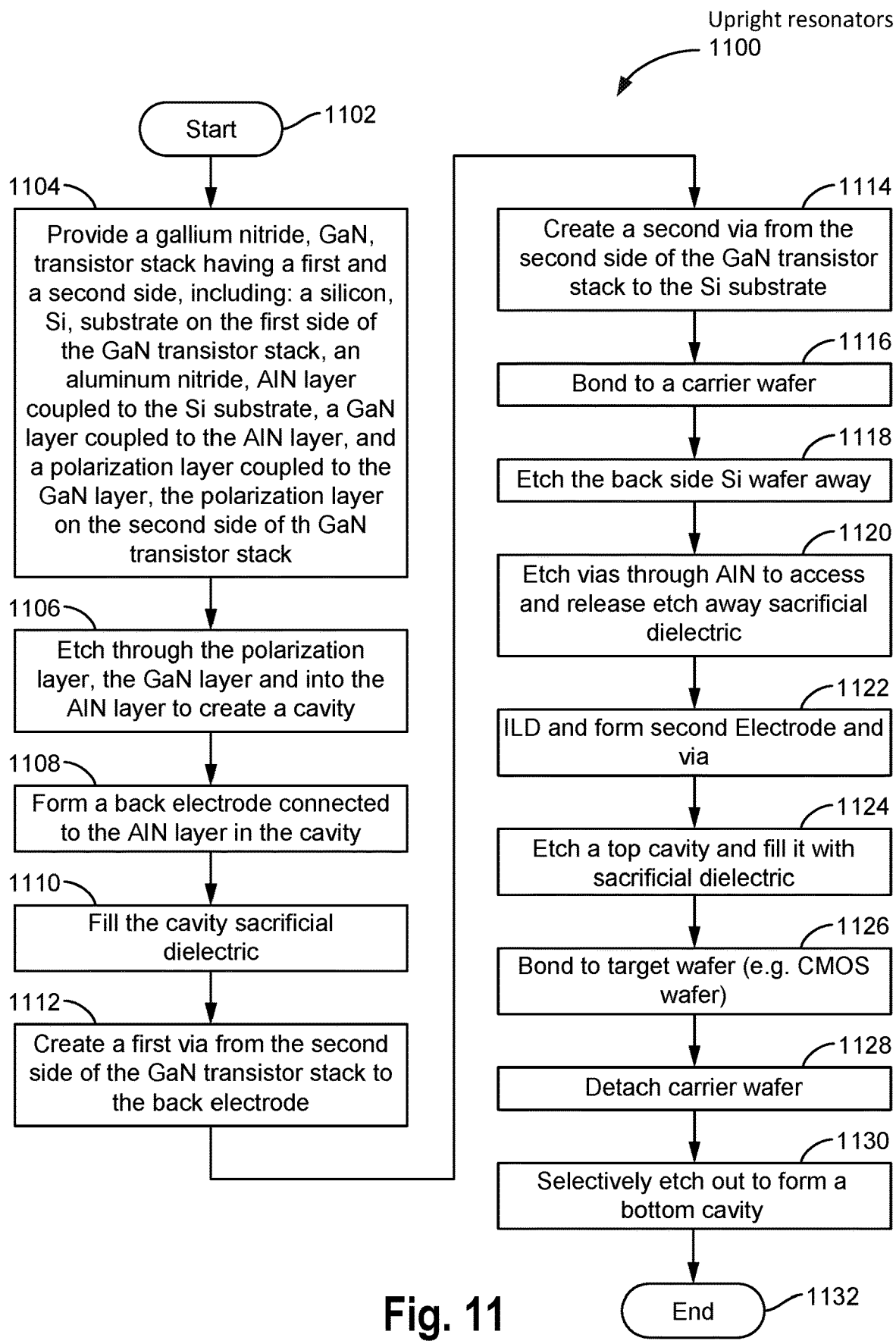
FIG. 11 is a flow diagram for illustrating a method for fabricating a donor wafer with an array of MEMS resonators that are upright, in accordance with some embodiments.

FIG. 11 is a flow diagram for illustrating a method for fabricating a donor wafer with an array of MEMs resonators that are upright, in accordance with some embodiments. FIGS. 12A-12G schematically illustrate a cross-section side view of an IC structure 1200 during various stages of the method of FIG. 11, in accordance with some embodiments. Accordingly, the method 1100 will be described below with references to FIGS. 12A-12G. Similar fabrication principles to those described herein may be used to form IC structures with other configurations than that shown in FIGS. 12A-12G.

At block 1102, the method 1100 may start.

At block 1104 the method 1100 may provide a gallium nitride, GaN, transistor stack having a first and a second side, including: a substrate (e.g., silicon) on the first side of the GaN transistor stack, an aluminum nitride, AlN layer coupled to the Si substrate, a GaN layer coupled to the AlN layer, and a polarization layer coupled to the GaN layer, the polarization layer on the second side of the GaN transistor stack.

At block 1106, the method 1100 may etch through the polarization layer, the GaN layer and into the AlN layer to create a cavity.

Figure 12A:
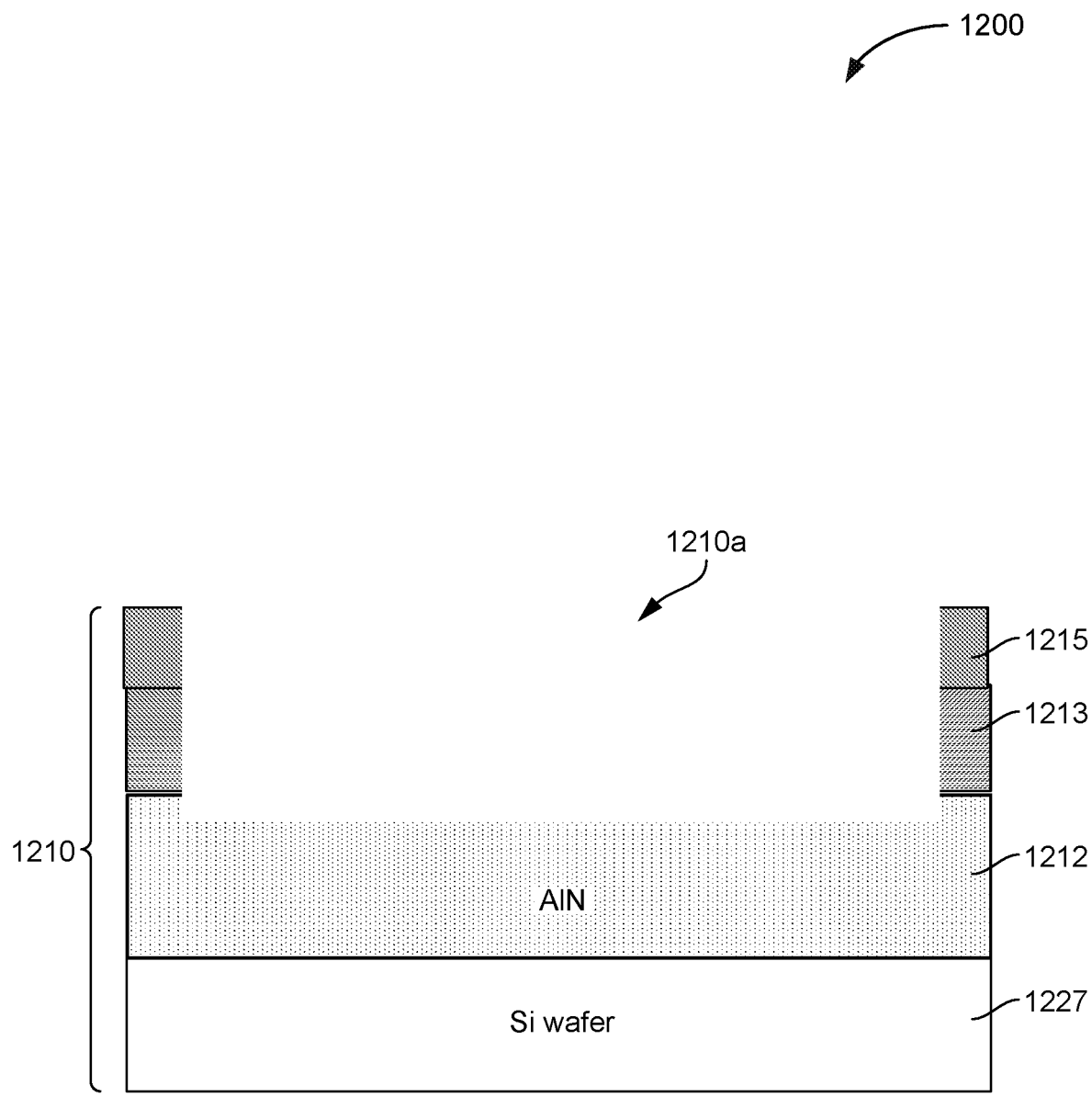
FIGS. 12A-12G schematically illustrate a cross-section side view of an IC structure during various stages of the method of FIG. 11, in accordance with some embodiments.

In embodiments, FIG. 12A illustrates a GaN transistor stack 1210, that includes a SI substrate 1227, that is coupled to an AlN layer 1212. In embodiments, the AlN layer 1212 may be between 0.2 and 1.0 μm, in thickness. A GaN layer 1213 may be coupled to the AlN layer 1212, and a polarization layer 1215 may be coupled to the GaN layer 1213. A cavity 1210a may be etched through the polarization layer 1015, the GaN layer 1013, and into the AlN layer 1212.

At block 1108, the method 1100 may form a back electrode connected to the AlN layer in the cavity.

At block 1110, the method 1100 may fill the cavity with a sacrificial dielectric.

At block 1112, the method 1100 may create a first via that extends from the second side of the GaN transistor stack to the back electrode.

At block 1114, the method 1100 may create a second via that extends from the second side of the GaN transistor stack to the Si substrate.

Figure 12B:
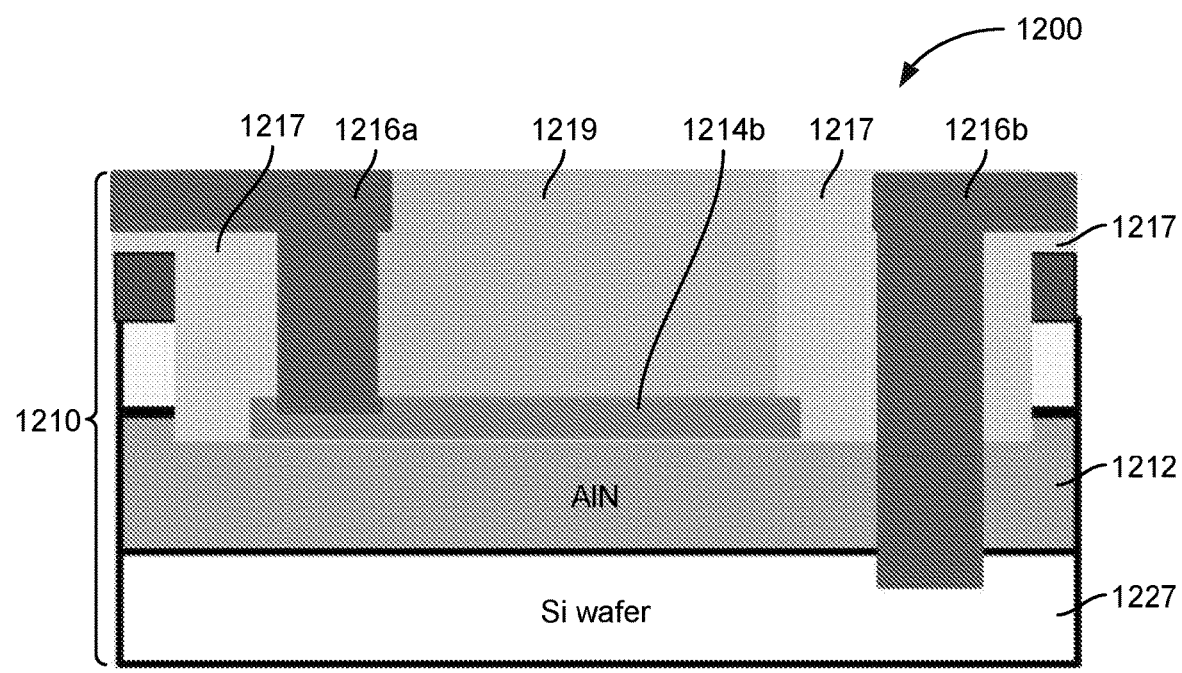

FIG. 12B illustrates a GaN transistor stack 1210 in which the cavity 1210a from FIG. 10B may be filled and may include a back electrode 1214b (e.g., copper). The back electrode 1214b may be coupled to the AlN layer 1212, a dielectric 1217, a sacrificial dielectric 1219, a first via 1216a that extends through the GaN transistor stack 1210 to the back electrode 1214b, and a second via 1216b that extends through the GaN transistor stack 1210 to the silicon substrate 1227.

At block 1116, the method 1100 may bond the GaN transistor stack to a carrier wafer.

Figure 12C:
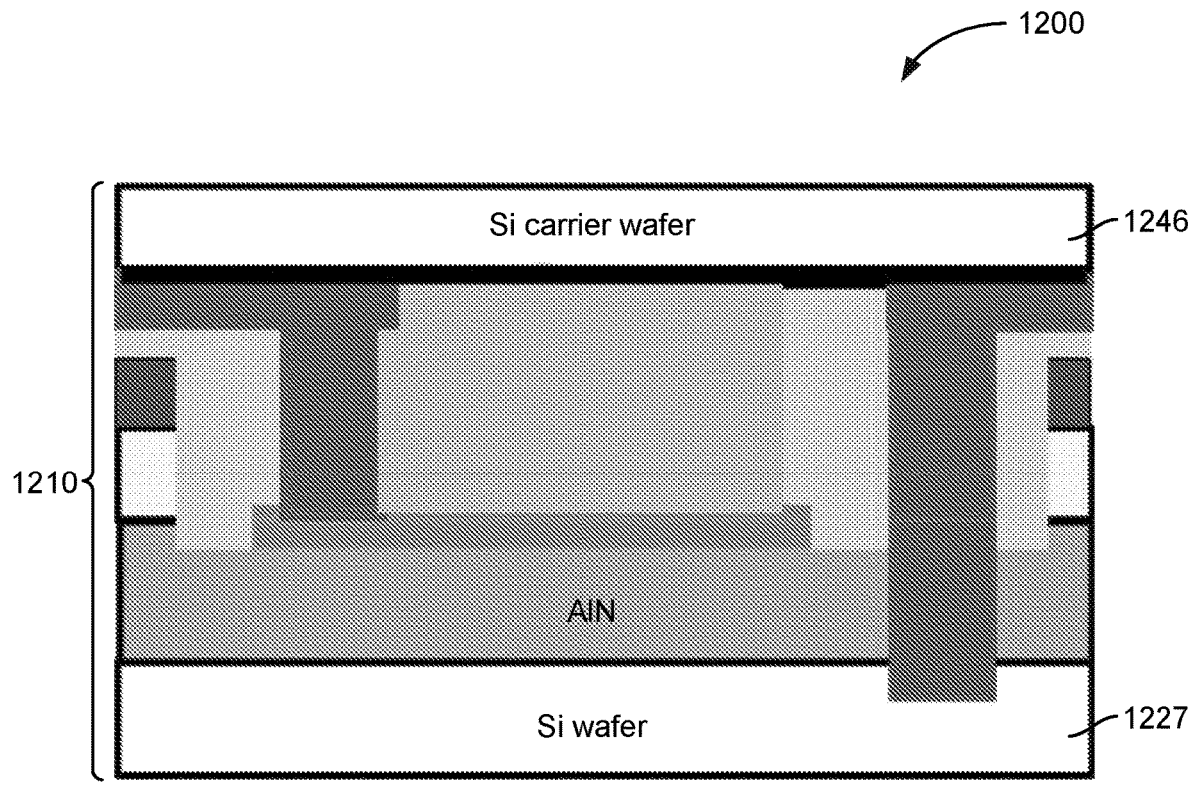

FIG. 12C illustrates a carrier wafer 1246 that is attached to the GaN transistor stack 1210, at the opposite side of the Si wafer 1227.

At block 1118, the method 1100 may etch the back side Si wafer away.

At block 1120, the method 1100 may etch vias through the AlN layer to access and etch away the sacrificial dielectric.

Figure 12D:
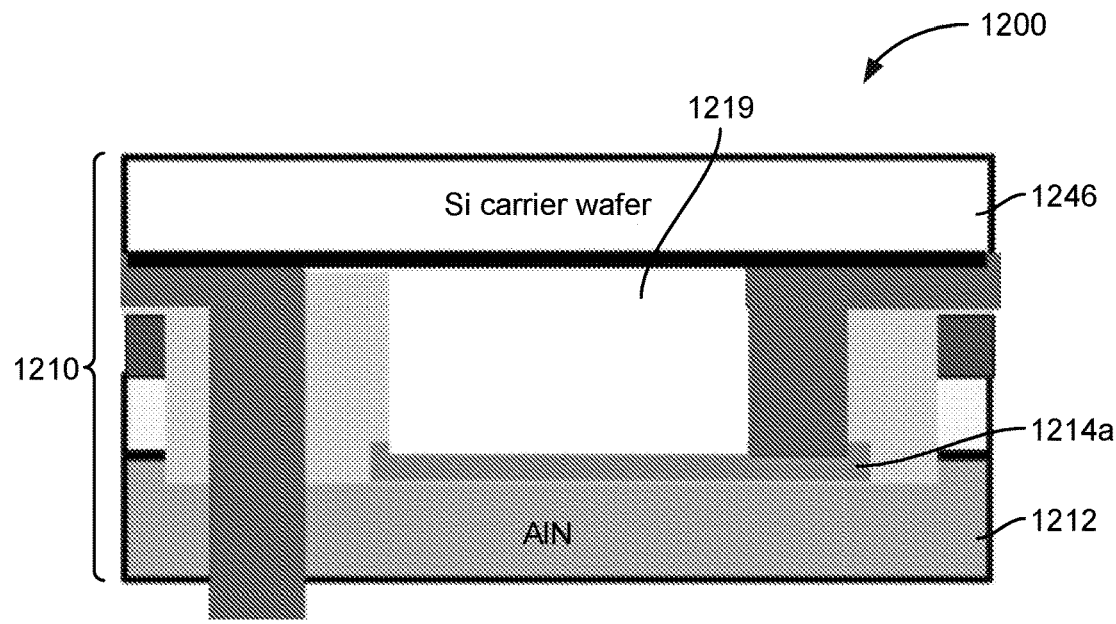

FIG. 12D illustrates the removal of the Si wafer 1227 from the GaN transistor stack 1210. In embodiments, the removal may be accomplished through etching and/or other removal techniques. In embodiments, vias (not shown) may be etched through the AlN layer 1212 to access and etch away sacrificial dielectric 1219.

At block 1122, the method 1100 may couple a second electrode onto the AlN layer, and may couple an ILD layer on the second electrode and the AlN layer.

At block 1124, the method 1100 may etch a top cavity and fill it with sacrificial dielectric.

Figure 12E:
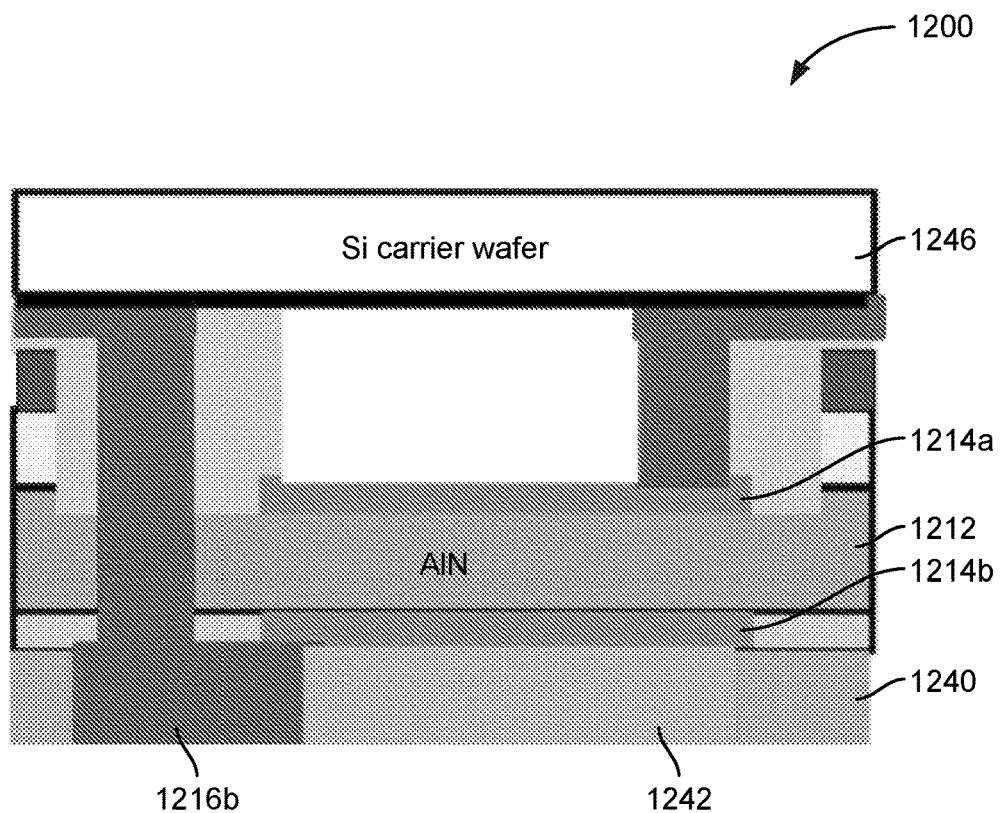

FIG. 12E illustrates the placement of the second electrode 1214b on the AlN layer 1212. In embodiments, the ILD layer 1240 is placed on the electrode 1214b and the AlN layer 1212. In embodiments, a via may be etched in a top cavity and filled with sacrificial dielectric 1242.

At block 1126, the method 1100 may bond the GaN transistor stack to a target wafer.

Figure 12F:
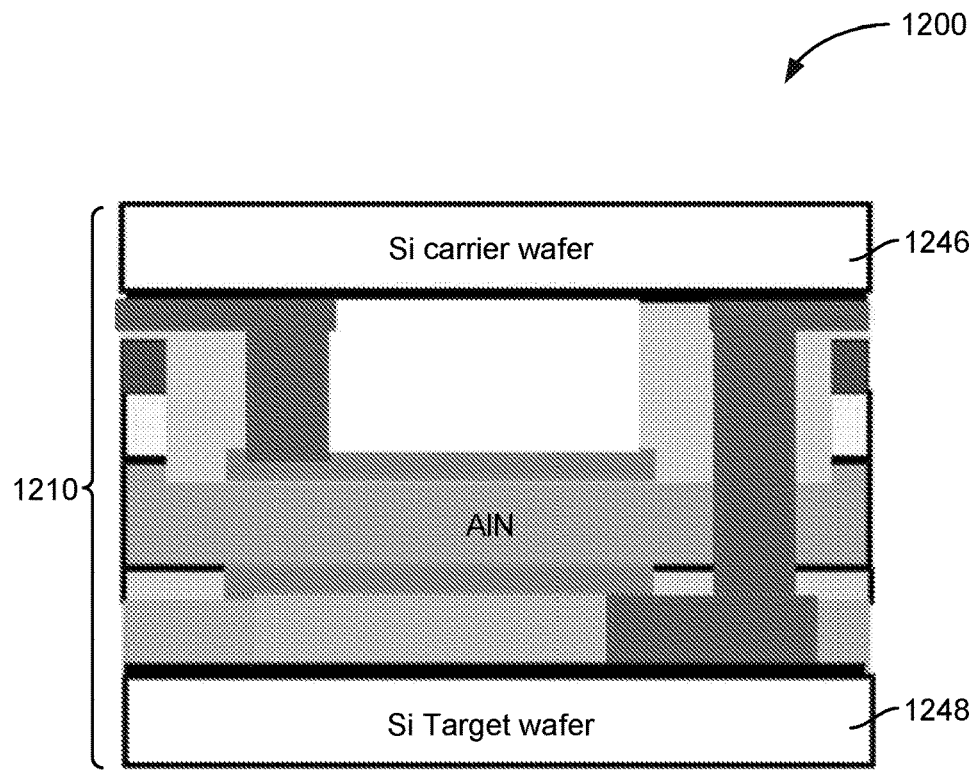

FIG. 12F illustrates the bonding of a target wafer 1248 to the GaN transistor stack 1210.

At block 1128, the method 1100 may detach the carrier wafer from the GaN transistor stack.

At block 1130, the method 1100 may selectively etch out the sacrificial dielectric to form a bottom cavity.

Figure 12G:
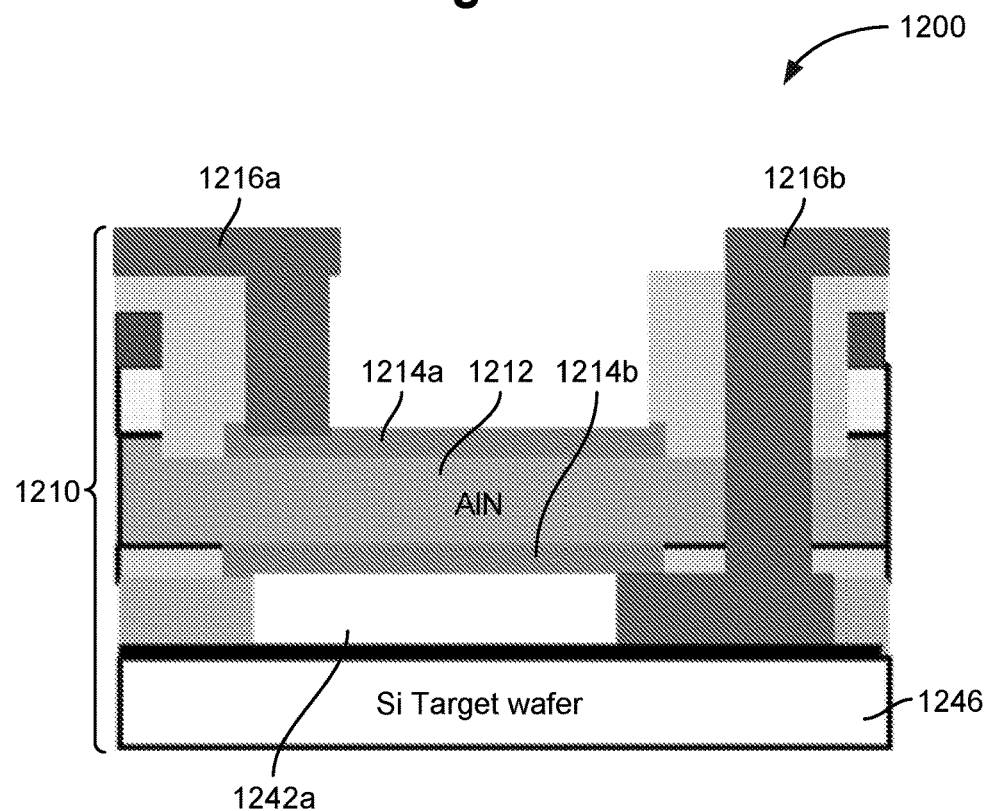

FIG. 12G illustrates the removal of the carrier wafer 1246. This may be done through an etching process. The cavity 1242a may be created by selectively etching out the sacrificial dielectric 1242.

FIG. 11, at block 1130, the method 1100 may stop.

Figure 13:
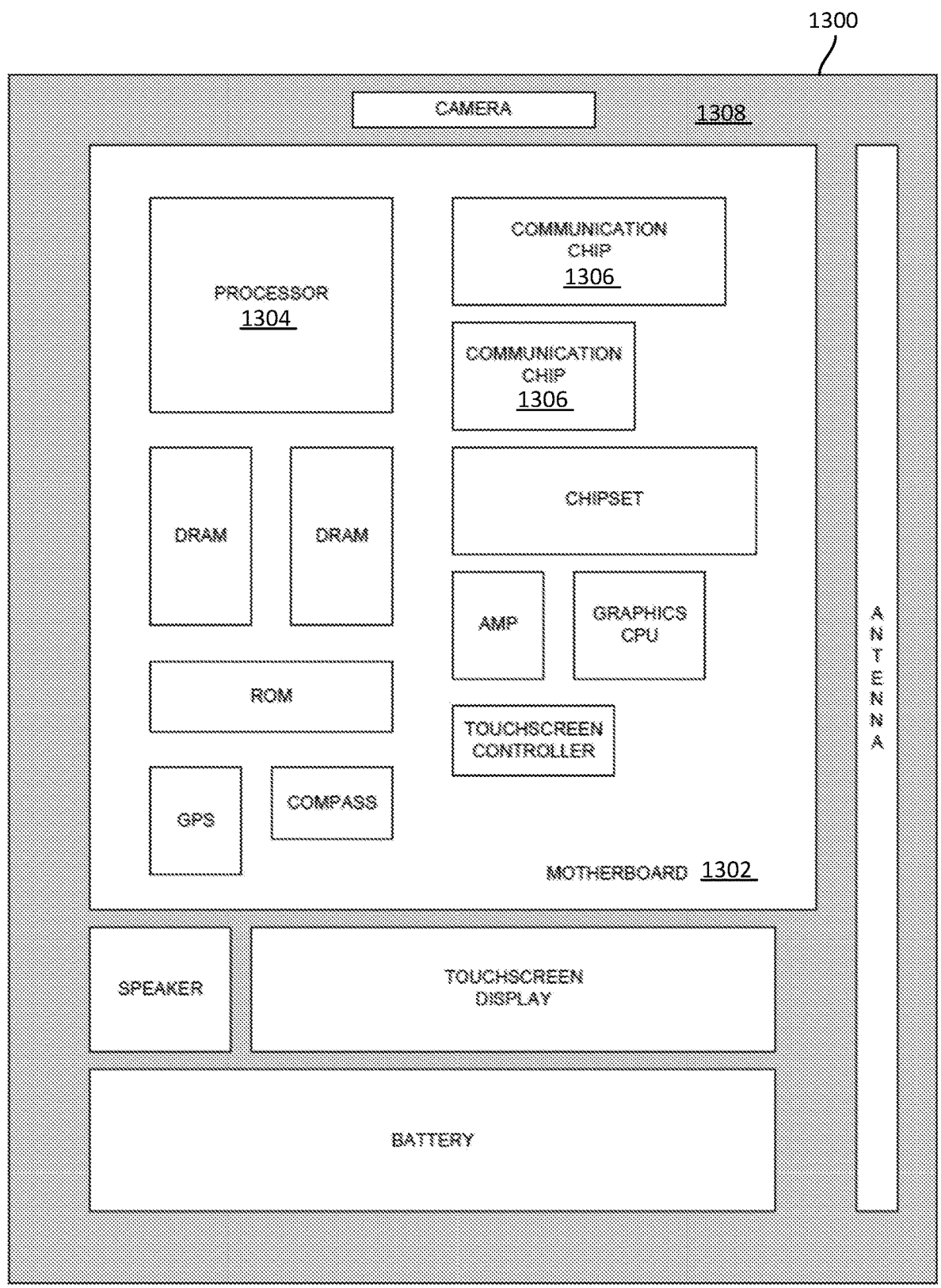
FIG. 13 schematically illustrates an example system that may include an integration of a 3-dimensional island for an RF filter front end assembly as described herein, in accordance with some embodiments.

FIG. 13 schematically illustrates an example system (e.g., computing device 1300) that may include an IC structure (e.g., IC structure 300 of FIG. 3, 400 of FIG. 4, 600 of FIG. 6H, 800 of FIG. 8J, 1000 of FIG. 10G, 1200 of FIG. 12G, and/or an IC structure formed using methods 500, 700, 900, or 1100) as described herein, in accordance with some embodiments. Components of the computing device 1300 may be housed in an enclosure (e.g., housing 1308). The motherboard 1302 may include a number of components, including but not limited to a processor 1304 and at least one communication chip 1306. The processor 1304 may be physically and electrically coupled to the motherboard 1302. In some implementations, the at least one communication chip 1306 may also be physically and electrically coupled to the motherboard 1302. In further implementations, the communication chip 1306 may be part of the processor 1304.

Depending on its applications, computing device 1300 may include other components that may or may not be physically and electrically coupled to the motherboard 1302. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1306 may enable wireless communications for the transfer of data to and from the computing device 1300. The term "Wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., LTE-Advanced project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1306 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1306 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, EV-DO, and others.

The processor 1304 of the computing device 1300 may include a die (e.g., die 102 of FIGS. 1-2) having an IC structure (e.g., IC structure 300 of FIG. 3, 400 of FIG. 4, 600 of FIG. 6H, 800 of FIG. 8J, 1000 of FIG. 10G, 1200 of FIG. 12G, and/or an IC structure formed using methods 500, 700, 900, or 1100) as described herein. For example, the die 102 of FIGS. 1-2 may be mounted in a package assembly that is mounted on a circuit board such as the motherboard 1302. The term "processor" may refer to any device or portion of a device that processes electronic data from registers and/or memory to transform that electronic data into other electronic data that may be stored in registers and/or memory.

The communication chip 1306 may also include a die (e.g., die 102 of FIGS. 1-2) having an IC structure (e.g., IC structure 300 of FIG. 3, 400 of FIG. 4, 600 of FIG. 6H, 800 of FIG. 8J, 1000 of FIG. 10G, 1200 of FIG. 12G, and/or an IC structure formed using methods 500, 700, 900, or 1100) as described herein. In further implementations, another component (e.g., memory device or other integrated circuit device) housed within the computing device 1300 may contain a die (e.g., die 102 of FIGS. 1-2) having an IC structure (e.g., IC structure 300 of FIG. 3, 400 of FIG. 4, 600 of FIG. 6H, 800 of FIG. 8J, 1000 of FIG. 10G, 1200 of FIG. 12G, and/or an IC structure formed using methods 500, 700, 900, or 1100) as described herein.

In various implementations, the computing device 1300 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Some non-limiting Examples of various embodiments are provided below.

Example 1 may be a method for fabricating a radio frequency, RF, filter using 3-dimensional island integration, comprising: providing a donor wafer assembly including: a substrate having a first side and a second side, a resonator layer having a first and a second side, the first side of the resonator layer coupled to the first side of the substrate, the resonator layer including a plurality of resonator circuits, a first resonator circuit being separated from a second resonator circuit by a gap material, creating a cavity through the substrate and into the first side of the resonator layer to expose an electrode of the first resonator circuit; providing an RF wafer having a first side and a second side, the first side having a first level and a second level, the second level being higher than the first level and including an oxide layer; coupling the first resonator circuit to the second level of the first side of the RF wafer, with the cavity adjacent the first side of the RF wafer; and removing the donor wafer assembly to leave the first resonator circuit coupled to the second level of the first side of the RF wafer.

Example 2 may be the method of Example 1, further comprising: aligning the first resonator circuit with the second level of the first side of the RF wafer; causing the first resonator circuit to come into contact with the second level of the first side of the RF wafer; and wherein the coupling comprises performing a bonding process.

Example 3 may be the method of Example 2, wherein the bonding process includes oxide fusion bonding.

Example 4 may be the method of Example 2, wherein performing the bonding process further comprises bonding a portion of the first resonator circuit surrounding the cavity to the second level of the first side of the RF wafer.

Example 5 may be the method of Example 1, further comprising, before the coupling, thinning the substrate of the donor wafer assembly.

Example 6 may be the method of Example 1, wherein providing the donor wafer assembly further includes providing: a weak adhesive layer coupled to the second side of the resonator layer, a low-temperature oxide layer coupled to the weak adhesive layer, and a carrier wafer coupled to the low-temperature oxide layer.

Example 7 may be the method of Example 6, wherein the removing the resonator assembly includes breaking away the first resonator circuit from the donor wafer at the weak adhesive layer and at the gap material adjacent to the first resonator circuit.

Example 8 may be the method of Example 7, wherein the gap material is scored.

Example 9 may be the method of Example 1, wherein the resonator circuit includes an aluminum nitride, AlN, layer between the electrode and another electrode of the resonator circuit.

Example 10 may be the method of Example 9, wherein the first resonator circuit includes one or more film bulk acoustic resonators, FBARs.

Example 11 may be the method of Example 1, wherein the donor wafer assembly further includes an oxide layer disposed on the first side of the resonator layer; and wherein creating a cavity into the first side of the resonator layer to expose an electrode of the first resonator circuit further includes etching through the oxide layer to expose the electrode, leaving a portion of the oxide layer surrounding the cavity to couple with the second level of the first side of the RF wafer.

Example 12 may be a radio frequency (RF) circuit assembly comprising: a substrate; an RF circuit disposed on the first substrate, wherein a front side of the RF circuit has a first level and a second level, the second level being higher than the first level and including an oxide layer; an intermediate layer having a first side and a second side, wherein the first side of the intermediate layer is coupled to the second level of the RF circuit; a resonator circuit formed on the second side of the intermediate layer, the resonator circuit including an electrode; and a cavity through the intermediate layer and into the resonator circuit to expose the electrode.

Example 13 may be the assembly of Example 12, wherein the intermediate layer is silicon.

Example 14 may be the assembly of Example 12, wherein the intermediate layer is an oxide layer.

Example 15 maybe the assembly of Example 12, wherein the intermediate layer of the first resonator circuit is bonded to the second level of the front side of the RF circuit.

Example 16 may be the assembly of Example 12, wherein the electrode is a first electrode, and wherein the resonator circuit further includes a second electrode and an aluminum nitride, AlN, layer between the first electrode and the second electrode.

Example 17 maybe the assembly of Example 16, wherein the cavity is a first cavity, and wherein the assembly further includes a second cavity to expose the second electrode.

Example 18 may be the assembly of Example 16, wherein the AlN layer is an epitaxial layer.

Example 19 may be a method for fabricating a resonator circuit comprising: forming an aluminum nitride, AlN, layer on a substrate, the AlN layer having a first side adjacent the substrate and a second side opposite the first side; forming a first electrode on the second side of the AlN layer; removing a portion of the substrate to expose the first side of the AlN layer; and forming, after removing the portion of the substrate, a second electrode on the first side of the AlN layer.

Example 20 may be the method of Example 19, wherein forming the AlN layer includes epitaxially depositing the AlN layer.

Example 21 may be the method of Example 19, further comprising: forming an oxide layer on the second electrode; and forming a cavity in the oxide layer to expose the second electrode and leave a portion of the oxide layer around the cavity.

Example 22 may be the method of Example 21, further comprising bonding the portion of the oxide layer to a mesa of a radio frequency circuit.

Example 23 may be the method of Example 19, further comprising: forming a gallium nitride, GaN, layer on the second side of the AlN layer; forming a polarization layer on the GaN layer; and removing a portion of the polarization layer and the gallium nitride layer to expose a portion of the second side of the AlN layer; wherein the forming the first electrode on the second side of the AlN layer includes forming the first electrode on the exposed portion of the second side of the AlN layer.

Example 24 may be the method of Example 19, further comprising: forming a dielectric on the first electrode; coupling a target wafer to the dielectric; and after removing the portion of the substrate to expose the first side of the AlN layer, forming a via through the AlN layer; and removing the dielectric through the via to provide a cavity adjacent the first electrode.

Example 25 may be a radio frequency, RF, filter, comprising: a filter wafer assembly including: a resonator layer having a first and a second side, the first side being silicon, Si, 111 coupled to an aluminum nitrate, AlN, epitaxial layer, the second side having a bottom electrode and contact metallization, the resonator layer including a plurality of resonator circuits, a first resonator circuit being separated from a second resonator circuit by a gap material; a weak adhesive layer coupled to the second side of the resonator layer, a low-temperature oxide layer coupled to the weak adhesive layer, a carrier wafer coupled to the low-temperature oxide layer, a cavity into the first side of the resonator layer to expose the AlN epitaxial layer of the first resonator circuit, a second electrode connected to the AlN epitaxial layer, an etched oxide spacer layer coupled to the second electrode and the epitaxial layer; an RF assembly including: an RF wafer having a first and a second side, the first side having a first and a second level, the second level being higher than the first level and coupled to an oxide layer; and wherein the first resonator circuit and the second level of the first side of the RF wafer are coupled.

Example 26 may be the apparatus of Example 25, wherein the first resonator circuit and the second level of the first side of the RF wafer are coupled with an oxide fusion.

Example 27 may be the apparatus of Example 25, wherein the gap material is a porous dielectric.

Example 28 may be the apparatus of Example 25, wherein the plurality of resonator circuits further include film bulk acoustic resonators, FBARs.

Example 29 may be a method for fabricating an aluminum nitride, AlN resonator circuit from a gallium nitride, GaN, transistor stack using metalorganic chemical vapor deposition, MOCVD, comprising: providing a GaN transistor stack having a first and a second side, including: a silicon, Si, substrate on the first side of the GaN transistor stack, an AlN layer coupled to the Si substrate, a GaN layer coupled to the AlN layer, and a polarization layer coupled to the GaN layer, the polarization layer on the second side of the GaN transistor stack; etching through the polarization layer, the GaN layer and into the AlN layer to create a cavity; forming a back electrode connected to the AlN layer in the cavity; filling the cavity with sacrificial dielectric; creating a first via from the second side of the GaN transistor stack to the back electrode; creating a second via from the second side of the GaN transistor stack to the Si substrate; coupling a Si target wafer to the second side of the GaN transistor stack; etching away the Si substrate on the first side of the GaN transistor stack; etching away third vias through AlN layer to release etch away sacrificial dielectric; coupling a top electrode to the AlN layer; applying an inter-level dielectric, ILD, to the AlN and the top electrode; forming a via through the ILD layer an exposing part of the top electrode; and etching the ILD to expose a second part of the top electrode.

Example 30 may be the method of Example 29, wherein the back electrode or the top electrode is copper.

Example 31 may be an aluminum nitride, AlN resonator circuit from a gallium nitride, GaN, transistor stack apparatus, comprising: a silicon, Si, substrate; an AlN layer coupled to the Si substrate; a GaN layer coupled to the AlN layer; a polarization layer coupled to the GaN layer; a back electrode connected to a first side of the AlN layer; a top electrode connected to a second side of the AlN layer; and a top cavity adjacent to the top electrode.

Example 32 may be the resonator circuit of Example 31, wherein the back electrode or the top electrode is copper.

Example 33 may be a method for fabricating an aluminum nitride, AlN, resonator circuit from a GaN transistor stack comprising: providing a gallium nitride, GaN transistor stack having a first and a second side, including: a silicon, Si, carrier wafer on the first side of the GaN transistor stack, a AlN layer coupled to the Si carrier wafer, a GaN layer coupled to the AlN layer, and a polarization layer coupled to the GaN layer, the polarization layer on the second side of the GaN transistor stack; etching through the polarization layer, the GaN layer and into the AlN layer to create a cavity; forming a back electrode in the cavity connected to the AlN layer; filling the cavity with sacrificial dielectric; creating a first via from the second side of the GaN transistor stack to the back electrode; creating a second via from the second side of the GaN transistor stack to the Si substrate; coupling a Si target wafer to the second side of the GaN transistor stack; coupling a top electrode to the AlN layer; applying an inter-level dielectric, ILD, to the AlN and the top electrode; etching a portion of the ILD to the top electrode; filling the etched portion of the ILD with sacrificial dielectric; bonding a target wafer to the filled and etched portion of the ILD; detaching the Si carrier wafer.

Example 34 may be the method of Example 33, wherein the back electrode or the top electrode is copper.

Example 35 may be a resonator circuit apparatus, comprising: an aluminum nitride, AlN, layer; a back electrode coupled to a first side of the AlN layer; a cavity between the back electrode and a silicon, Si, target wafer; a top electrode coupled to a second side of the AlN layer; a GaN layer coupled to the AlN layer; a polarization layer coupled to the GaN layer; a first via connecting the target wafer and back electrode through the second side of the AlN layer, the first via not in contact with the top electrode; a second via connecting the top electrode without connecting to the AlN layer; and a second cavity above the AlN layer and within the first and the second vias.

Example 36 may be the apparatus of Example 35, wherein the back electrode or the top electrode are copper.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation

What is claimed is:

1. A radio frequency (RF) circuit assembly comprising:
a substrate;
an RF circuit with a back side coupled with the substrate, wherein a front side of the RF circuit opposite the back side has a first level and a second level laterally adjacent to the first level, wherein the second level is higher than the first level;
a resonator circuit formed on the second level, wherein the resonator circuit includes an electrode and a cavity between the electrode and a surface of the second level, and wherein the resonator circuit extends continuously from a first side of the second level to a second side opposite the first side of the second level, and wherein the resonator circuit overlaps and extends beyond the first side of the second level or the second side of the second level; and
wherein the second level comprises an oxide mesa that extends continuously across the entire cavity.

2. The assembly of claim 1, wherein the resonator circuit is bonded to the second level of the front side of the RF circuit.

3. The assembly of claim 1, wherein the electrode is a first electrode, and wherein the resonator circuit further includes a second electrode and an aluminum nitride (AlN) layer between the first electrode and the second electrode.

4. The assembly of claim 3, wherein the cavity is a first cavity, and wherein the assembly further includes a second cavity to expose the second electrode.

5. The assembly of claim 3, wherein the AlN layer is an epitaxial layer.

* * * * *